(12) United States Patent  
Ponnuswamy et al.

(10) Patent No.: US 8,703,615 B1  
(45) Date of Patent: Apr. 22, 2014

(54) COPPER ELECTROPLATING PROCESS FOR UNIFORM ACROSS WAFER DEPOSITION AND VOID FREE FILLING ON RUTHENIUM COATED WAFERS

(75) Inventors: Thomas A. Ponnuswamy, Sherwood, OR (US); John H. Sukamto, Lake Oswego, OR (US); Jonathan D. Reid, Sherwood, OR (US); Steven T. Mayer, Lake Oswego, OR (US); Huanfeng Zhu, Tigard, OR (US)

(73) Assignee: Novellus Systems, Inc., Fremont, CA (US)

( * ) Notice: Subject to any disclaimer, the term of this patent is extended or adjusted under 35 U.S.C. 154(b) by 243 days.

(21) Appl. No.: 13/367,710

(22) Filed: Feb. 7, 2012

Related U.S. Application Data

(63) Continuation-in-part of application No. 12/785,205, filed on May 21, 2010, now Pat. No. 8,513,124, which is a continuation-in-part of application No. 12/075,023, filed on Mar. 6, 2008, now Pat. No. 7,964,506.

(60) Provisional application No. 61/180,803, filed on May 22, 2009.

(51) Int. Cl.  
*H01L 21/44* (2006.01)

(52) U.S. Cl.  
USPC ............ 438/687; 257/E21.586; 257/E21.575; 257/E23.161

(58) Field of Classification Search  
None  
See application file for complete search history.

(56) References Cited

U.S. PATENT DOCUMENTS

| | | | |
|---|---|---|---|
| 1,969,553 A | 8/1934 | Gernes | |
| 3,652,442 A | 3/1972 | Powers et al. | |
| 3,706,651 A | 12/1972 | Leland | |
| 3,862,891 A | 1/1975 | Smith | |
| 4,033,833 A | 7/1977 | Bestel et al. | |
| 4,082,638 A | 4/1978 | Jumer | |
| 4,240,886 A | 12/1980 | Hodges et al. | |
| 4,272,335 A | 6/1981 | Combs | |
| 4,304,641 A | 12/1981 | Grandia et al. | |

(Continued)

FOREIGN PATENT DOCUMENTS

| EP | 0037325 | 3/1981 |
|---|---|---|
| JP | 59-162298 | 9/1984 |

(Continued)

OTHER PUBLICATIONS

Fang et al., "Uniform Copper Electroplating on Resistive Substrates," Abs. 167, 205$^{th}$ Meeting, © 2004 The Electrochemical Society, Inc., 1 page.

(Continued)

*Primary Examiner* — Sonya D McCall Shepard  
(74) *Attorney, Agent, or Firm* — Weaver Austin Villeneuve & Sampson LLP

(57) ABSTRACT

Disclosed are methods of depositing and annealing a copper seed layer. A copper seed layer may be deposited on a ruthenium layer disposed on a surface of a wafer and on features in the wafer. The thickness of the ruthenium layer may be about 40 Angstroms or less. The copper seed layer may be annealed in a reducing atmosphere having an oxygen concentration of about 2 parts per million or less. Annealing the copper seed layer in a low-oxygen atmosphere may improve the properties of the copper seed layer.

24 Claims, 12 Drawing Sheets

(56) References Cited

U.S. PATENT DOCUMENTS

| | | |
|---|---|---|
| 4,357,220 A | 11/1982 | Eisenmann |
| 4,469,564 A | 9/1984 | Okinaka et al. |
| 4,604,177 A | 8/1986 | Sivilotti |
| 4,604,178 A | 8/1986 | Fleegener et al. |
| 4,605,482 A | 8/1986 | Shiragami et al. |
| 4,696,729 A | 9/1987 | Santini |
| 4,828,654 A | 5/1989 | Reed |
| 4,906,346 A | 3/1990 | Hadersbeck et al. |
| 4,931,149 A | 6/1990 | Stierman et al. |
| 4,933,061 A | 6/1990 | Kulkarni et al. |
| 5,039,381 A | 8/1991 | Mullarkey |
| 5,096,550 A | 3/1992 | Mayer et al. |
| 5,146,136 A | 9/1992 | Ogura et al. |
| 5,156,730 A | 10/1992 | Bhatt et al. |
| 5,162,079 A | 11/1992 | Brown |
| 5,217,586 A | 6/1993 | Datta et al. |
| 5,316,642 A | 5/1994 | Young, Jr. et al. |
| 5,368,711 A | 11/1994 | Poris |
| 5,391,285 A | 2/1995 | Lytle et al. |
| 5,421,987 A | 6/1995 | Tzanavaras et al. |
| 5,443,707 A | 8/1995 | Mori |
| 5,472,592 A | 12/1995 | Lowery |
| 5,476,578 A | 12/1995 | Forand |
| 5,498,325 A | 3/1996 | Nishimura et al. |
| 5,516,412 A | 5/1996 | Andricacos et al. |
| 5,567,300 A | 10/1996 | Datta et al. |
| 5,913,147 A | 6/1999 | Dublin et al. |
| 5,935,402 A | 8/1999 | Fanti |
| 5,982,606 A | 11/1999 | Masuda et al. |
| 6,027,631 A | 2/2000 | Broadbent |
| 6,113,771 A | 9/2000 | Landau et al. |
| 6,126,798 A | 10/2000 | Reid et al. |
| 6,132,587 A | 10/2000 | Jorne et al. |
| 6,136,707 A | 10/2000 | Cohen |
| 6,179,983 B1 | 1/2001 | Reid et al. |
| 6,193,860 B1 | 2/2001 | Weling |
| 6,197,181 B1 | 3/2001 | Chen |
| 6,297,157 B1 | 10/2001 | Lopatin et al. |
| 6,350,366 B1 | 2/2002 | Landau et al. |
| 6,391,166 B1 | 5/2002 | Wang |
| 6,395,152 B1 | 5/2002 | Wang |
| 6,402,923 B1 | 6/2002 | Mayer et al. |
| 6,497,801 B1 | 12/2002 | Woodruff et al. |
| 6,527,920 B1 | 3/2003 | Mayer et al. |
| 6,569,299 B1 | 5/2003 | Reid et al. |
| 6,755,954 B2 | 6/2004 | Mayer et al. |
| 6,773,571 B1 | 8/2004 | Mayer et al. |
| 6,783,611 B2 | 8/2004 | Yajima et al. |
| 6,800,187 B1 | 10/2004 | Reid et al. |
| 7,682,498 B1 | 3/2010 | Mayer et al. |
| 7,799,684 B1 | 9/2010 | Reid et al. |
| 7,964,506 B1 | 6/2011 | Ponnuswamy et al. |
| 2002/0195352 A1 | 12/2002 | Mayer et al. |
| 2003/0102210 A1 | 6/2003 | Woodruff et al. |
| 2004/0061919 A1 | 4/2004 | Tench et al. |
| 2004/0065540 A1 | 4/2004 | Mayer et al. |
| 2005/0006245 A1 | 1/2005 | Sun et al. |
| 2005/0009325 A1 | 1/2005 | Chung et al. |
| 2005/0173252 A1 | 8/2005 | Chen |
| 2006/0178007 A1 | 8/2006 | Nakamura et al. |
| 2006/0266655 A1 | 11/2006 | Sun et al. |
| 2007/0238265 A1 | 10/2007 | Kurashina et al. |
| 2008/0242088 A1* | 10/2008 | Suzuki .......................... 438/687 |
| 2009/0277867 A1 | 11/2009 | Mayer et al. |
| 2009/0280649 A1 | 11/2009 | Mayer et al. |
| 2010/0032304 A1 | 2/2010 | Mayer et al. |

FOREIGN PATENT DOCUMENTS

| | | |
|---|---|---|
| JP | 09-53197 | 2/1997 |
| JP | 2001316887 | 11/2001 |
| WO | WO/9941434 | 8/1999 |

OTHER PUBLICATIONS

Oliver Chyan et al. "Electrodeposition of Copper Thin Film on Ruthenium", Journal of The Electochemical Society, 150 (5) pp. C347-C350 (2003).

Ken M. Takahashi "Electroplating Copper onto Resistive Barrier Films", Journal of the Electrochemical Society, 147(4) 1414-1417 (2000).

T.P. Hoar and J. N. Agar "Factors in Throwing Power Illustrated by Potential-Current Diagrams" Received Mar. 13, 1947.

Damascene Cu Electroplating Chemistry, Handbook of Semiconductor Manufacturing Technology, © 2008 by Taylor & Francis Group, LLC.

W.A. Fairweather, "The Throwing Power of Acid Copper Plating Processes for Printed Circuit Boards", Imasa ltd., Slough, Berkshire MS received May 10, 1983.

U.S. Office Action mailed Feb. 19, 2009 issued in U.S. Appl. No. 12/075,023.

U.S. Office Action mailed Sep. 15, 2009 issued in U.S. Appl. No. 12/075,023.

U.S. Office Action mailed Nov. 4, 2009 in U.S. Appl. No. 11/682,175.

U.S. Office Action mailed Mar. 5, 2010 in U.S. Appl. No. 12/075,023.

Ponnuswamy et al., "Copper Electroplating Process for Uniform Across Wafer Deposition and Void Free Filling on Semi-Noble Metal Coated Wafers", U.S. Appl. No. 12/785,205, filed May 21, 2010.

U.S. Notice of Allowance and Allowed Claims mailed May 17, 2010 in U.S. Appl. No. 11/682,175.

Reid et al., "Method and Apparatus for Filling Interconnect Structures", U.S. Appl. No. 13/108,894, filed May 16, 2011.

Reid et al., "Method and Apparatus for Filling Interconnect Structures", U.S. Appl. No. 13/108,881, filed May 16, 2011.

U.S. Office Action mailed Jan. 26, 2012 in U.S. Appl. No. 12/785,205.

* cited by examiner

US 8,703,615 B1

COPPER ELECTROPLATING PROCESS FOR UNIFORM ACROSS WAFER DEPOSITION AND VOID FREE FILLING ON RUTHENIUM COATED WAFERS

CROSS-REFERENCE TO RELATED APPLICATIONS

This application is a continuation-in-part of U.S. patent application Ser. No. 12/785,205, filed May 21, 2010, which is herein incorporated by reference. U.S. patent application Ser. No. 12/785,205 is a continuation-in-part of U.S. patent application Ser. No. 12/075,023, filed Mar. 6, 2008, now U.S. Pat. No. 7,964,506, which is herein incorporated by reference. U.S. patent application Ser. No. 12/785,205 claims priority to U.S. Provisional Patent Application No. 61/180,803, filed May 22, 2009, which is herein incorporated by reference.

FIELD OF THE INVENTION

The present invention relates generally to methods and apparatus for depositing copper onto a wafer and more particularly to methods and apparatus for electroplating a copper layer on a semiconductor wafer. It is particularly useful for electroplating copper in damascene and dual damascene integrated circuit fabrication methods.

BACKGROUND OF THE INVENTION

Manufacturing of semiconductor devices commonly requires deposition of electrically conductive material on semiconductor wafers. The conductive material, such as copper, is often deposited by electroplating onto a seed layer of copper deposited onto the wafer surface by a physical vapor deposition (PVD) or chemical vapor deposition (CVD) method. Electroplating is a method of choice for depositing metal into the vias and trenches of the processed wafer during damascene and dual damascene processing.

Damascene processing is used for forming interconnections on integrated circuits (ICs). Damascene processing involves formation of inlaid metal lines in trenches and vias formed in a dielectric layer (inter-metal dielectric). In a typical damascene process, a pattern of trenches and vias is etched in the dielectric layer of a semiconductor wafer substrate. A thin layer of diffusion-barrier film such as tantalum, tantalum nitride, or a TaN/Ta bi-layer is then deposited onto the wafer surface by a PVD method, followed by deposition of seed layer of copper on top of the diffusion-barrier layer. Typical materials for diffusion barrier layers include titanium (Ti), tantalum (Ta), tantalum nitride (TaN), tantalum nitride silicon (TaNSi), tungsten (W), titanium nitride (TiN), titanium nitride silicon (TiNSi) and the like.

The trenches and vias are filled with copper mostly commonly using an electroplating process. Because electroplating must occur on a conductive layer, a copper seed layer is first deposited on the diffusion barrier layer with CVD or PVD methods. Chemical vapor deposition (CVD) methods can deposit a conformal copper seed layer with good adhesion, but CVD methods are expensive as compared to PVD processes. Physical vapor deposition (PVD) methods can deposit a copper seed layer with good adhesion, but produces a less conformal film that covers the sidewalls and bottoms of trenches poorly. A thicker PVD seed layer is therefore generally considered necessary to ensure that an electrically conductive layer is provided for subsequent electroplating. The thicker PVD seed layer increases aspect ratios in features and may pinch off the gap opening, making the features harder or impossible to fill with an electroplating process.

SUMMARY

Disclosed are methods of and apparatus for depositing a copper seed layer or a copper alloy seed layer.

In one embodiment, a method includes providing a semiconductor wafer having a ruthenium layer about 40 Angstroms thick or less on a surface of and on features in the semiconductor wafer. A copper seed layer is deposited on the ruthenium layer. The copper seed layer is annealed in a reducing atmosphere having an oxygen concentration of about 2 parts per million or less. In some embodiments, a root mean square roughness of the copper seed layer is about 40 Angstroms or less after annealing the copper seed layer.

In one embodiment, a method includes providing a semiconductor wafer having a ruthenium layer about 40 Angstroms thick or less on a surface of and on features in the semiconductor wafer. A copper alloy seed layer is deposited on the ruthenium layer. The copper alloy seed layer is annealed in a reducing atmosphere having an oxygen concentration of about 2 parts per million or less. In some embodiments, a root mean square roughness of the copper alloy seed layer is about 40 Angstroms or less after annealing the copper alloy seed layer.

In one embodiment, a non-transitory computer machine-readable medium includes program instructions for control of an apparatus. The instructions include code for providing a semiconductor wafer having a ruthenium layer about 40 Angstroms thick or less on a surface of and on features in the semiconductor wafer, depositing a copper seed layer on the ruthenium layer, and annealing the copper seed layer in a reducing atmosphere having an oxygen concentration of about 2 parts per million or less.

In one embodiment, a system includes an electroplating apparatus, an annealing furnace, and one or more controllers including program instructions for conducting a process. The process includes receiving a semiconductor wafer in the electroplating apparatus, depositing a copper seed layer on the wafer in the electroplating apparatus with an electroplating process, under conditions for depositing the copper seed layer on a ruthenium layer having a thickness of about 40 Angstroms or less on the semiconductor wafer surface and in features in the semiconductor wafer, and annealing the copper seed layer in a reducing atmosphere having an oxygen concentration of about 2 parts per million or less in the annealing furnace.

These and other features and advantages of the embodiments will be described in more detail below with reference to the associated drawings.

DETAILED DESCRIPTION

Introduction and Overview

Figure 1A:
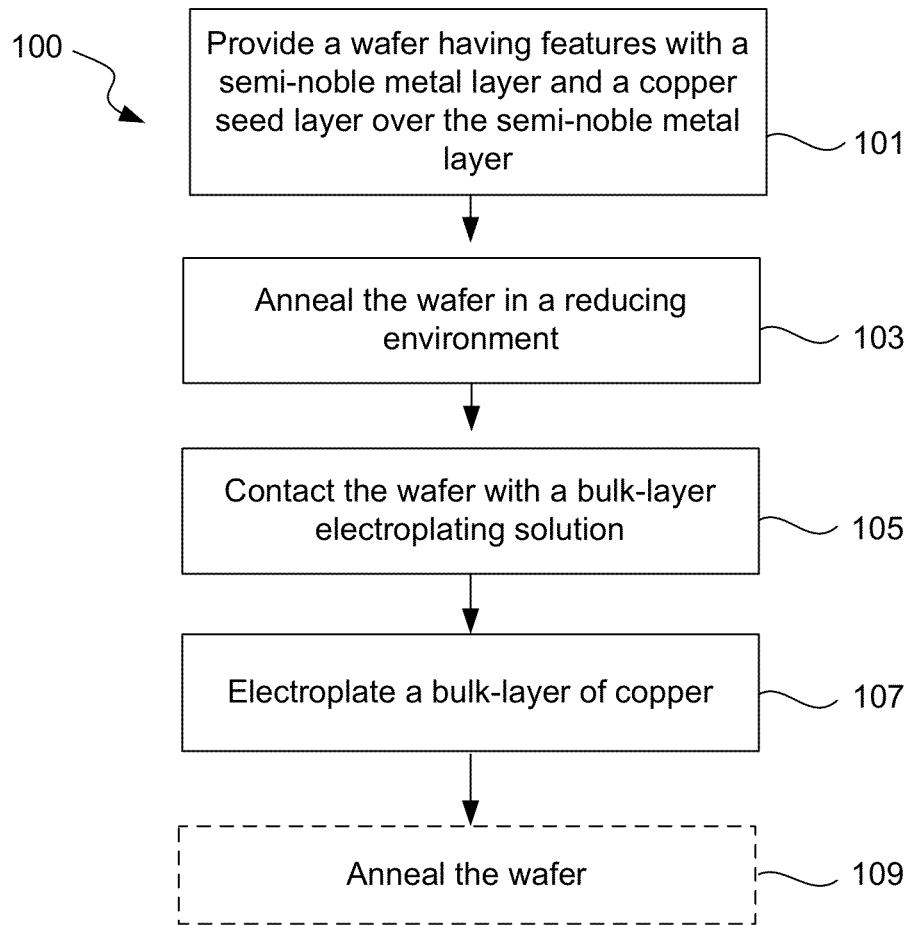
FIGS. 1A-1C are process flow diagrams illustrating some embodiments of the method.

In the following description, numerous specific details are set forth in order to provide a thorough understanding of the present invention. The present invention may be practiced without some or all of these specific details. In other instances, well known process operations have not been described in detail to not unnecessarily obscure the present invention. While the invention will be described in conjunction with the specific embodiments, it will be understood that it is not intended to limit the invention to the embodiments.

In this disclosure various terms are used to describe a semiconductor processing work surface, and "wafer" and "substrate" are used interchangeably. The process of depositing, or plating, metal onto a conductive surface via an electrochemical reaction are referred to generally as electroplating or electrofilling. Bulk electrofilling refers to electroplating a relatively large amount of copper to fill trenches and vias.

As the on-chip interconnect wiring dimensions approach and surpass the 45 nanometer (nm) scale, barrier materials are occupying an increasing fraction of the area. This is highly undesirable due to the resulting increase in line resistance resulting from a decrease in total copper volume, as well as possible overhang surrounding the via, which causes the copper electrofill to pinch off and leave void defects in the features. In order to achieve finer features, the multi-layer structure must be simplified. As the scale down of feature sizes continues, there is an increasing demand for a new generation of diffusion barrier materials. Good candidates for future diffusion barriers should have good adhesion to both copper and the dielectric layer, provide a conductive platform for copper plating, and be immiscible with copper.

In addition to using new diffusion barrier materials, the limitations of PVD seed layers should be addressed. The basic requirements for a copper seed layer are continuous sidewall coverage, adequate opening dimensions at the top of the features after deposition so as to allow bottom-up filling during electroplating, and good adhesion to the barrier layer. The copper seed layer must have low enough resistance to enable subsequent bulk electroplating. Common problems with PVD seed layers include excessive pinch-off near the feature opening, leading to voids near the center of features during bottom-up filling, and patchy discontinuous seed layers exposing oxidized tantalum barrier onto which electroplating does not take place, such that voids are formed along the sides of the features at the locations of exposed barrier. These limitations of PVD copper seed are addressed herein using diffusion barrier materials and treatment methods that produce a surface suitable for bulk electroplating without voids.

One way to address these limitations of PVD copper seed is to use an electroplating process to deposit the seed layer. An electroplating process can deposit a conformal and continuous copper seed layer onto a conductive surface that is free of insulating oxides. Typical diffusion barrier layers such as tantalum and tantalum nitride have relatively high resistivity (about 220 $\mu\Omega$-cm), and in addition form highly stable oxides onto which electrodeposition of adherent densely nucleated films is difficult or impossible. Deposition of a conductive elemental layer that forms an oxide that is conductive, reducible to the metal, or soluble in the plating electrolyte has been explored as a means to overcome these problems. Ruthenium and other semi-noble metals, which have a resistivity of about 9 $\mu\Omega$-cm, may be deposited on a TaN layer to provide diffusion barrier/liners of relatively low resistivity and desirable oxide film properties. In some cases, ruthenium and other semi-noble metals may also be suitable as the barrier layer.

Even though ruthenium is more conductive than TaN, it is still less conductive than a copper seed using a PVD process. For a thin ruthenium film, the sheet resistance is very high, at about 100 to 200 ohm/square. The sheet resistance of the conductive layer increases as its thickness decreases. When the sheet resistance is high, a voltage drop (termed the terminal effect) exists between the edge of the wafer where electrical contact is made and the center of the wafer. This resistive drop persists during the electroplating process until sufficient plating increases the conductance across the wafer and reduces the voltage drop. The resistive drop results in a larger voltage driving the plating reaction near the edge of the wafer and thus a faster deposition rate at the wafer edge. As a result, the deposited layer has a concave profile with an increased thickness near the edge of the wafer relative to its center. This terminal effect substantially increases the plated thickness near the wafer edge in substrates having seed layers or plated layers with sheet resistances greater than 1 ohm/square, but will result in progressively greater edge thickness as sheet resistance increases further. The impact of terminal effect in generating thickness variation is mostly concentrated in the outer 15 to 30 mm of the wafer diameter, especially in substrates having thin seed layers. Therefore, copper deposition on ruthenium with conventional electroplating processes yields edge thick films due to this high resistance.

When plating on a high resistance surface, the electrolyte should ideally have low conductivity. When the bath conductivity is decreased, the relative voltage drop between the wafer center and wafer edge compared to the overall voltage drop through the plating cell becomes small. The thickness distribution is improved because the voltage driving the reaction at the wafer edge is not much larger relative to that at the wafer center. A low conductivity (high resistivity) electrolyte has a resistivity higher than about 200 ohm cm, higher than about 1000 ohm cm in some embodiments, which is significantly higher than the conventional electroplating baths resistivity of about 2 to 20 ohm cm.

Another way to address the limitation of PVD copper seed is a novel treatment combined with different diffusion barrier materials. When the copper seed layer is deposited using a PVD process, the copper seed layer may not be conformal and continuous. As explained above, the PVD copper seed can pinch-off near the feature opening and deposits at the sidewalls may be reduced or discontinuous as compared to the feature bottom or on the field regions between the features. When deposited over conventional diffusion barrier materials such as tantalum and tantalum nitride, such discontinuous coverage can cause voids during bulk-layer electroplating. However, when deposited over semi-noble metal layers, the undesirable effects of such discontinuous coverage can be remediated by annealing the copper seed layer under conditions disclosed herein to produce a surface suitable for bulk electroplating resulting in an copper interconnect without voids.

Figure 1B:
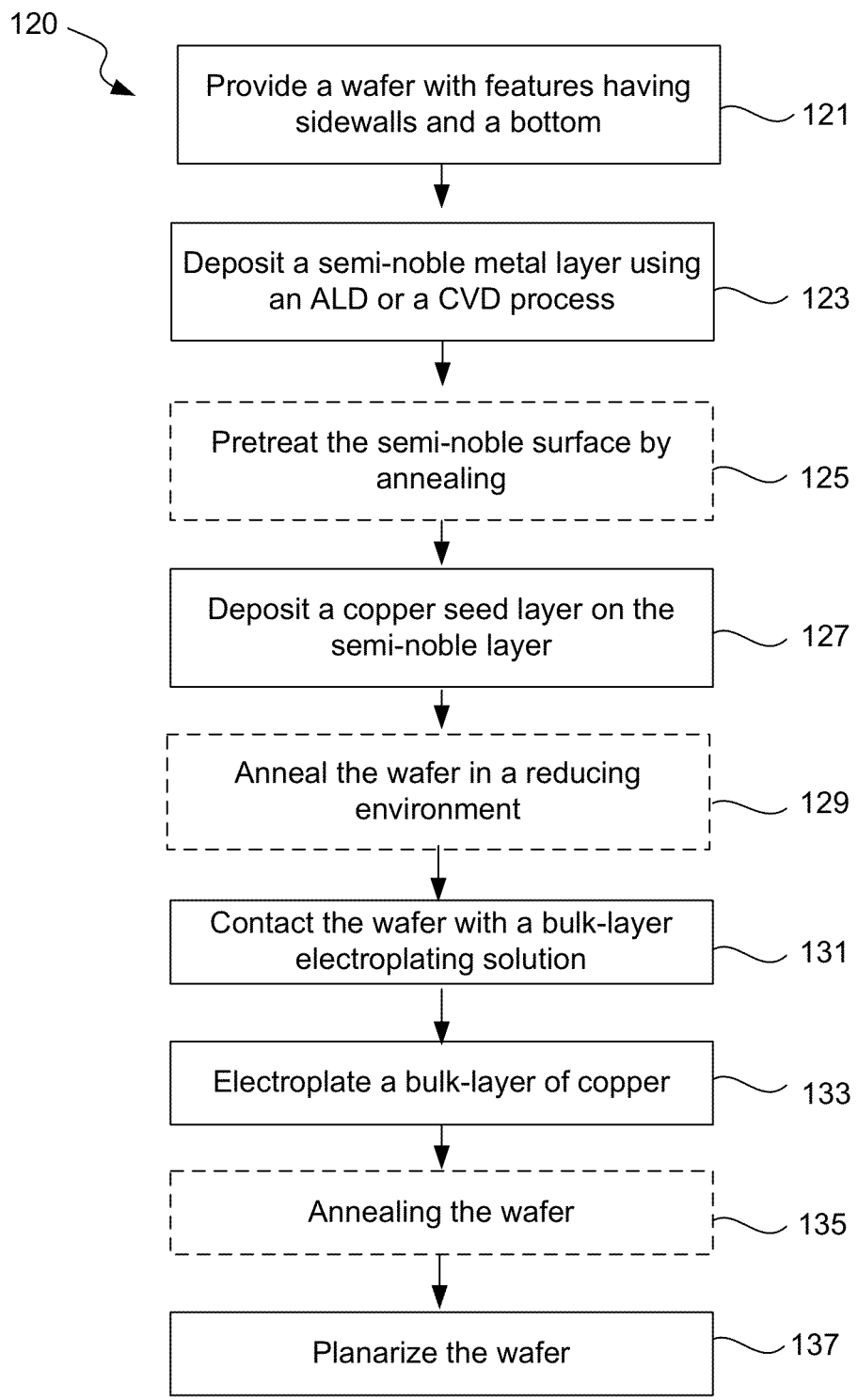
Figure 1C:
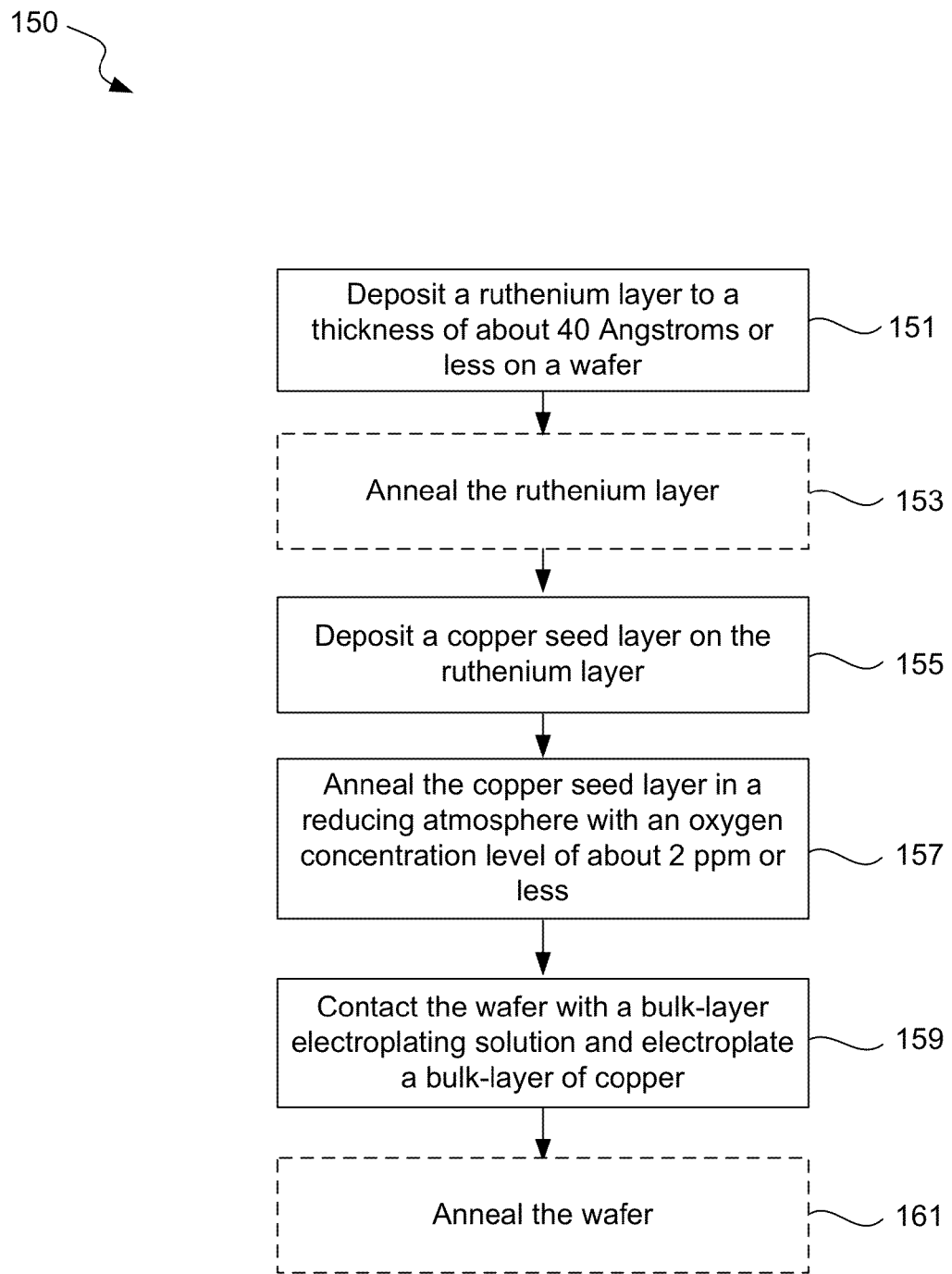

FIGS. 1A-1C show process flows for addressing the limitations of PVD copper seed, and more generally for forming conductive lines in semiconductor wafers employing a semi-noble metal diffusion barrier layer. A general process flow 100 is shown in FIG. 1A for operations that may be performed on the same semiconductor processing tool. In operation 101, a wafer is provided. The wafer has features with a semi-noble metal layer and a copper seed layer over the semi-noble metal layer. The features are commonly trenches and vias for forming copper interconnects in a Damascene process. In some embodiments, the features may have depths of about 15 nm to 100 nm and may have openings with a dimension of about 10 nm to 30 nm before the semi-noble metal layer and the copper seed layer are deposited. In a semiconductor manufacturing environment, the wafer undergoes processing on many different semiconductor processing tools or apparatuses. Usually, the semi-noble metal layer and the copper seed layer are deposited using a processing tool different from that of the bulk-layer electroplating. In certain cases, the copper seed layer may be deposited using the same tool as the bulk-layer electroplating, if an electroplating process is used for the copper seed layer, as described herein. More generally, the copper seed layer may be deposited using a number of methods including PVD, CVD, electroplating, and electroless plating. The seed layer may have an average thickness of about 15 to 75 Angstroms or larger. Certain portions of the seed layer may have smaller dimensions when the coverage is not conformal and may be zero where the coverage is discontinuous. As discussed above, the disclosed methods improve void formation performance for small features sizes where the seed layer is necessarily thinner. Regardless of how the copper seed layer is deposited, the process of FIG. 1A remains the same.

The semi-noble metal may be ruthenium, palladium, rhodium, iridium, osmium, cobalt, or nickel. In certain embodiments, the semi-noble metal is ruthenium. In other embodiments, the semi-noble metal is cobalt or nickel. The semi-noble metal layer serves as at least a portion of a diffusion barrier, for example, as a part of a bi-layer. In certain embodiments, the semi-noble metal layer may be the entire diffusion barrier layer.

In operation 103, the wafer is annealed in a reducing environment. The anneal takes place in the presence of forming gas, plasma, or other reducing atmosphere. The annealing temperature may be about 100 to 400° C., about 150 to 250° C., or about 150° C. The annealing temperature may be maintained for a period of about 10 to 1000 seconds, about 60 to 600 seconds, and about 120 seconds. In certain embodiments, the anneal may take place in the presence of inert gas. The annealing temperature may be in the higher end of the disclosed ranges.

After annealing, the wafer is placed in an electroplating bath with a bulk-layer electroplating solution in operation 105 and electroplated in operation 107. The general electroplating process is described in more detail below. After the bulk-layer electroplating, the wafer may be annealed in operation 109. The annealing conditions may be similar to the copper seed anneal. The bulk layer is typically annealed before planarizing the bulk copper, but not in all embodiments. The post electrofill anneal has been found to grow and stabilize grain structure in electroplated copper, but is not limited to a reducing atmosphere. Typical post electrofill anneal conditions range from about 100 to 225° C. for about 90 seconds to 1 hour. The bulk copper after the post electrofill anneal planarizes, e.g., chemical mechanical polishing, at a consistent rate and has a lower resistance and better electromigration lifetimes. However, the post electrofill anneal can result in void formation. The post electrofill anneal stresses the electroplated copper and causes voids to form at the copper-ruthenium interface.

FIG. 1B shows a process flow 120 in accordance with various embodiments disclosed herein. A wafer with features having sidewalls and bottoms is provided at operation 121. The features may be a dielectric material with trenches and vias etched therein for depositing of liner/barrier layer and copper interconnect. The features may also include some liner/barrier layer material. For example a layer of titanium (Ti), tantalum (Ta), tantalum nitride (TaN), tantalum nitride silicon (TaNSi), tungsten (W), titanium nitride (TiN), or titanium nitride silicon (TiNSi) may be deposited first.

In operation 123, a semi-noble metal layer is usually deposited using an ALD or a CVD process. Both ALD and CVD type deposition techniques are considered to result in smooth and conformal layers within the features, thereby increasing the process window to obtain void-free fill in the subsequent electroplating step. The availability of appropriate precursors which do not have a deleterious impact on either the dielectric or copper for these semi-noble metals allows for the deposition of these layers using either of these processes. An ALD process deposits a very thin layer of material using alternating doses of precursor material that first saturates the surface and then forms the thin layer deposit. A CVD process involves providing one or more gaseous reactants to the chamber (at the same time if there are multiple reactants) that react to deposit a film on the surface of the wafer, with or without plasma. The CVD process can deposit more material than the ALD process in the same amount of time. Although only ALD and CVD methods are commonly used to deposit a semi-noble metal layer, other deposition processes may be used as they develop and mature. For example, PVD methods to deposit some of the semi-noble metal materials (ruthenium, palladium, rhodium, iridium, osmium, cobalt, or nickel) may become more common.

After the semi-noble metal deposition, the surface may be treated by, e.g., annealing in operation 125. Pretreating the semi-noble metal surface may reduce surface oxide build-up between deposition processes and improve adhesion of the subsequent copper seed layer. Thus, the anneal may be performed immediately prior to the copper seed deposition, preferably in the same semiconductor process tool so as to avoid oxide buildup when the wafer is exposed to ambient conditions during wafer transfer between tools. The anneal conditions include inert gas and/or reducing atmosphere, such as forming gas, at a temperature of about 100° C. to 250° C., for a duration about 10 to 600 seconds.

A copper seed layer is deposited on the semi-noble metal layer in operation 127. As indicated, the copper seed layer may be deposited using a number of methods, for example, electroplating, electroless plating, PVD, and CVD. While electroplating may be used to deposit the copper seed layer on a semi-noble metal layer, the commonly accepted method for mass manufacturing is PVD. As discussed, PVD seed layers may be non-uniform and spotty, leaving some semi-noble metal layers exposed. Because the resistivity of the semi-noble metal layer is much lower than those of conventional barrier materials, such as tantalum, along with the fact that their oxides can be reduced, allows for the possibility of subsequent bulk-layer electroplating.

In some embodiments, a copper seed layer is deposited using a combination of different processing techniques. For example, in one copper seed layer deposition process, a partial copper seed layer is deposited on regions of the semi-noble metal layer using an ALD, CVD or PVD process (i.e., a dry process). In some embodiments, this partial copper seed layer is continuous over the regions onto which it is deposited. In other embodiments, it is discontinuous or partially discontinuous. As indicated, the partial copper seed layer may be annealed or otherwise treated to yield a more continuous partial copper seed layer over the regions on which it is deposited. Regardless of whether the partially deposited seed layer is annealed, the remainder of the seed layer may be deposited by a plating process such as an electrolytic plating process. With such process, the regions of the semi-noble metal layer that do not have a copper seed layer thereon are covered with a supplemental copper seed layer deposited using the plating process. In further embodiments, the CVD or PVD process is used to deposit a copper seed layer primarily on the field regions of the wafer. A subsequent electroplating process is used to deposit a copper seed layer within the features of the wafer. The combination of these processes yields a continuous copper seed layer over the semi-noble metal layer of the wafer.

After the copper seed layer is deposited, the wafer is optionally annealed in, e.g., a reducing environment in operation 129. The anneal takes place in the presence of forming gas, plasma, or other reducing atmosphere. The annealing temperature may be about 100 to 400° C., about 150 to 250° C., or about 150° C. The annealing temperature may be maintained for a period of about 10 to 1000 seconds, about 60 to 600 seconds, and about 120 seconds.

The anneal is believed to strengthen and stabilize the copper/semi-noble metal interface. Non-uniform semi-noble metal coverage and/or non-uniform copper seed layer coverage can result in a weak interface. A weak interface can result in void formation when the wafer undergoes stress during post electrofill anneal, which is used to grow and stabilize grain structure in the electroplated copper bulk-layer. Annealing under certain conditions can also cause the copper to agglomerate and cause void formation. For example, if the temperature is too high for too long (e.g., over 400° C. for more than 10 minutes), the copper can agglomerate and eliminate any benefit from strengthening and stabilizing the interface. The inventors discovered that annealing a copper seed layer deposited over a semi-noble metal layer, however, does not increase void formation, but rather decreases it under a specific range of annealing conditions. It is believed that the copper seed layer deposited over a semi-noble metal layer has a reduced tendency to agglomerate under these conditions. Note that the annealing benefit is a function of all the annealing conditions. At higher temperatures the duration may be shorter. Lower temperature may require longer anneals. One skilled in the art would design a suitable wafer flow based on the wafer thermal budget and availability of various processing modules.

After the wafer is optionally annealed at 129, the wafer is contacted with a bulk-fill electroplating solution in operation 131. The wafer is preferably immediately or quickly transferred to a plating bath containing the bulk-layer electroplating solution so as to avoid any oxidation due to exposure to tool environment. At the plating bath, a bulk-layer of copper is electroplated onto the wafer to fill the features in operation 133. A conventional electroplating chemistry and waveform may be used. The bulk-layer electroplating is able to completely fill the features without any voids even if the copper seed is discontinuous because the exposed annealed semi-noble metal layer can be electroplated to produce a strongly adherent copper seed/semi-noble interface. In certain embodiments, the electroplating chemistry and current or potential waveform are modified slightly to compensate for the slightly higher resistivity and sheet resistance from having some exposed semi-noble metal surface. For example, the slightly higher resistivity may increase a terminal effect during bulk-layer electroplating and with certain modifications, as described below, may be used to counter the terminal effect.

The wafer may be annealed at operation 135 after the bulk-electroplating. A post electrofill anneal has been found to improve planarization performance, but may add stress to the copper seed/semi-noble interface and form voids if the interface is not strengthened and stabilized first. In operation 137, the wafer is planarized, possibly by a chemical mechanical planarization (CMP) process to remove excess copper.

FIG. 1C shows a process flow 150 in accordance with some embodiments disclosed herein. In operation 151, a layer of ruthenium is deposited to of a thickness of about 40 Angstroms or less on a wafer including features. In some embodiments, the ruthenium layer may be about 30 Angstroms thick or less than about 30 Angstroms thick. In some embodiments, the ruthenium layer is about 15 Angstroms thick or less. The ruthenium layer is typically provided as a substantially conformal layer, such that the thickness values recited above are valid in both the field regions and the features of the underlying substrate surface.

The features in the wafer may include features having sidewalls and bottoms. For example, the features may include trenches and vias etched in a dielectric material. The features also may include liner/barrier layer materials. For example, a layer of titanium (Ti), tantalum (Ta), tantalum nitride (TaN), tantalum nitride silicon (TaNSi), tungsten (W), titanium nitride (TiN), or titanium nitride silicon (TiNSi) may be deposited on the features before the layer of ruthenium is deposited.

The ruthenium layer may be deposited using any appropriate physical and/or chemical process. Examples of chemical processes include ALD and CVD. Both ALD and CVD processes may produce smooth and conformal layers within the features, thereby increasing the process window to obtain void-free fill in the subsequent electroplating operations.

In operation 153, after the ruthenium layer deposition, the ruthenium layer may be annealed. Annealing the ruthenium layer may reduce surface oxide build-up between deposition processes and may improve adhesion of the subsequent copper seed layer. Thus, the anneal may be performed immediately prior to the copper seed deposition, and in some embodiments, in the same semiconductor process tool, so as to avoid oxide buildup when the wafer is exposed to ambient conditions during wafer transfer between tools. The anneal conditions may include inert gas and/or reducing atmospheres, such as forming gas, under annealing conditions described elsewhere herein. In certain embodiments, the anneal is conducted at a temperature of about 100° C. to 250° C. for a duration of about 10 seconds to 600 seconds.

In operation 155, a copper seed layer is deposited on the ruthenium layer. Operation 155 in FIG. 1C may be similar to operation 127 described above with reference to FIG. 1B. In some embodiments, the copper seed layer is deposited using an electroplating process, as described further below under "Electroplating the Copper Seed." In some embodiments a copper alloy seed layer is deposited using an electroplating process, as also described further below under "Electroplating the Copper Seed."

In some embodiments, the copper seed layer may be deposited with an electroplating process using forward and reverse current pulses. For example, in some embodiments employing 300 mm wafers, in an electroplating process a forward current of about 0.5 amps to 1.25 amps may be applied for about 2 seconds to 5 seconds and a reverse current of about 0.1 amps to 2 amps may be applied for about 50 milliseconds to 600 milliseconds. This sequence may be repeated for about 15 seconds to 60 seconds to electroplate the copper seed layer. In some embodiments, the reverse current may be about 0.1 amps to 0.5 amps for a period of about 100 milliseconds to 600 milliseconds. In some other embodiments, a reverse current of about 1 amp to 2 amps may be applied for about 50 milliseconds to 200 milliseconds.

For example, in some embodiments, in an electroplating process a forward current of about 0.75 amps may be applied for about 3 seconds and a reverse current of about 0.4 amps may be applied for about 150 milliseconds. This sequence may be repeated for about 30 seconds to electroplate the copper seed layer. In some other embodiments, in an electroplating process a reverse current may have a larger magnitude than a forward current. For example, a forward current may be about 0.75 amps and may be applied for about 3 seconds and a reverse current may be about 1.5 amps and may be applied for about 100 milliseconds. This sequence may be repeated for about 30 seconds to electroplate the copper seed layer. Additionally, over the duration of the seed deposition process, the number of coulombs passed in the forward current operations exceeds the number of coulombs passed in the reverse current operations.

In some embodiments, the reverse current operations may remove a portion of the copper seed layer in the peripheral regions of the wafer. That is, a portion of the copper seed layer on the surface of the wafer near the edges of the wafer may be removed when the reverse current is applied. Removing the copper seed layer from the peripheral regions of the wafer may aid in countering the terminal effect during the bulk-layer copper electroplating operation. In some embodiments, the last operation in the seed layer electroplating process may include a reverse current pulse.

In operation 157, the copper seed layer is annealed in a reducing atmosphere with an oxygen concentration of about 2 parts per million (ppm) or less. The anneal may be performed in forming gas, for example. A reducing atmosphere necessarily does not include oxidizing species. In some embodiments, the anneal is performed in an atmosphere having a low concentration of oxygen. In some embodiments, an atmosphere having an oxygen concentration of 10 ppm or less may be considered an atmosphere having a low concentration of oxygen. In some embodiments, the oxygen concentration of the anneal atmosphere is about 5 ppm or less, about 2 ppm or less, or about 1 ppm or less. In some embodiments, the oxygen concentration of the anneal atmosphere is about 1 ppm to 2 ppm. The annealing temperature may be about 100° C. to 400° C., about 100° C. to 200° C., or about 150° C. The annealing temperature may be maintained for a period of about 10 seconds to 1000 seconds, about 300 seconds to 900 seconds, or about 120 seconds.

In some embodiments, annealing the copper seed layer in an atmosphere having a low oxygen concentration may result in lower roughness and lower sheet resistance of the copper seed layer. For example, annealing the copper seed layer in an atmosphere having a low oxygen concentration may reduce the surface roughness (i.e., $R_s$, root mean square roughness) of the copper seed layer to about 40 Angstroms or less or to about 30 Angstroms or less for a 50 Angstrom thick copper seed layer. The low oxygen concentration atmosphere may prevent oxides from forming on the copper seed layer; such oxides may limit the reflow of the copper seed layer on the ruthenium layer. Further, annealing the copper seed layer in an atmosphere having a low oxygen concentration may reduce the sheet resistance of the copper seed layer to about 50 ohm/square or less, to about 40 ohm/square or less, or to about 35 ohm/square or less. The sheet resistance of a copper seed layer depends in part of the thickness of the ruthenium layer onto which the copper seed layer is deposited. The values of sheet resistance provided above are typically appropriate for copper seed layers having a thicknesses of about 3 Angstroms to 7 Angstroms or about 5 Angstroms. Annealing the copper seed layer is described further below under "Annealing the Copper Seed Layer."

Table I includes the average sheet resistance and the roughness of 25 Angstrom thick copper seed layers that were deposited on a 30 Angstrom thick ruthenium layer in atmospheres having different oxygen concentrations.

TABLE I

| $O_2$ concentration in anneal chamber [ppm] | average sheet resistance, Rs [ohm/square] | RMS [Angstroms] |
|---|---|---|
| 11 | 120.4 | 28.8 |
| 2 | 69.4 | 23.6 |
| 0.6 | 77.0 | 21.9 |

As shown, a low oxygen concentration atmosphere (i.e., 0.6 ppm to 2 ppm versus 11 ppm) during the copper seed layer anneal reduced both the sheet resistance and the roughness of the copper seed layer.

Table II includes the average sheet resistance and the roughness of 50 Angstrom thick copper seed layers that were deposited on a 30 Angstrom thick ruthenium layer in atmospheres having different oxygen concentrations.

TABLE II

| $O_2$ concentration in anneal chamber [ppm] | average sheet resistance, Rs [ohm/square] | RMS [Angstroms] |
|---|---|---|
| 10 | 44.7 | 35.5 |
| 2 | 29.4 | 32.9 |

As shown, a low oxygen concentration atmosphere (i.e., 2 ppm versus 10 ppm) during the copper seed layer anneal reduced both the sheet resistance and the roughness of the copper seed layer.

Table III includes the average sheet resistance of 50 Angstrom thick copper seed layers that were deposited on a 30 Angstrom thick ruthenium layer in atmospheres having different oxygen concentrations. Note that the 30 Angstrom thick ruthenium layer onto which 50 Angstroms of copper was deposited in Table III had a different morphology than the 30 Angstrom thick ruthenium layer onto which the 50 Angstrom of copper was deposited in the Table II. The different ruthenium layer morphologies yielded copper seed layers with different ranges of sheet resistances for the higher and the lower oxygen concentration atmospheres.

TABLE III

| $O_2$ concentration in anneal chamber [ppm] | average sheet resistance, Rs [ohm/square] |
|---|---|
| 11 | 68.7 |
| 8.3 | 70.9 |

TABLE III-continued

| O₂ concentration in anneal chamber [ppm] | average sheet resistance, Rs [ohm/square] |
|---|---|
| 4.2 | 68.2 |
| 2 | 48.3 |
| 0.6 | 52.9 |

As shown, a low oxygen concentration atmosphere (i.e., 0.6 ppm to 2 ppm versus 4.2 ppm to 11 ppm) during the copper seed layer anneal reduced the sheet resistance of the copper seed layer.

In operation 159, the wafer is contacted with a bulk-fill electroplating solution and a bulk-layer of copper is electroplated onto the wafer. In some embodiments, the wafer is immediately or quickly transferred to a plating bath containing the bulk-layer electroplating solution after annealing the copper seed layer so as to avoid any oxidation due to exposure to the tool environment. A conventional electroplating chemistry and waveform may be used. The bulk-layer electroplating may completely fill the features without any voids even if the copper seed layer is discontinuous because the exposed annealed ruthenium layer can be electroplated to produce a strongly adherent copper seed/ruthenium interface. In certain embodiments, the electroplating chemistry and current or potential waveform are modified slightly to compensate for the slightly higher resistivity and sheet resistance from having some exposed ruthenium surface. For example, the slightly higher resistivity may increase a terminal effect during bulk-layer electroplating and certain modifications, as described below, may be used to counter the terminal effect.

In operation 161, the wafer is annealed. A post-electrofill anneal may improve planarization performance, but also may add stress to the copper seed/ruthenium interface and form voids if the interface is not strengthened and stabilized first. The wafer may then be planarized (e.g., using a CMP process) to remove excess copper.

The Electroplating Process

Figure 2:
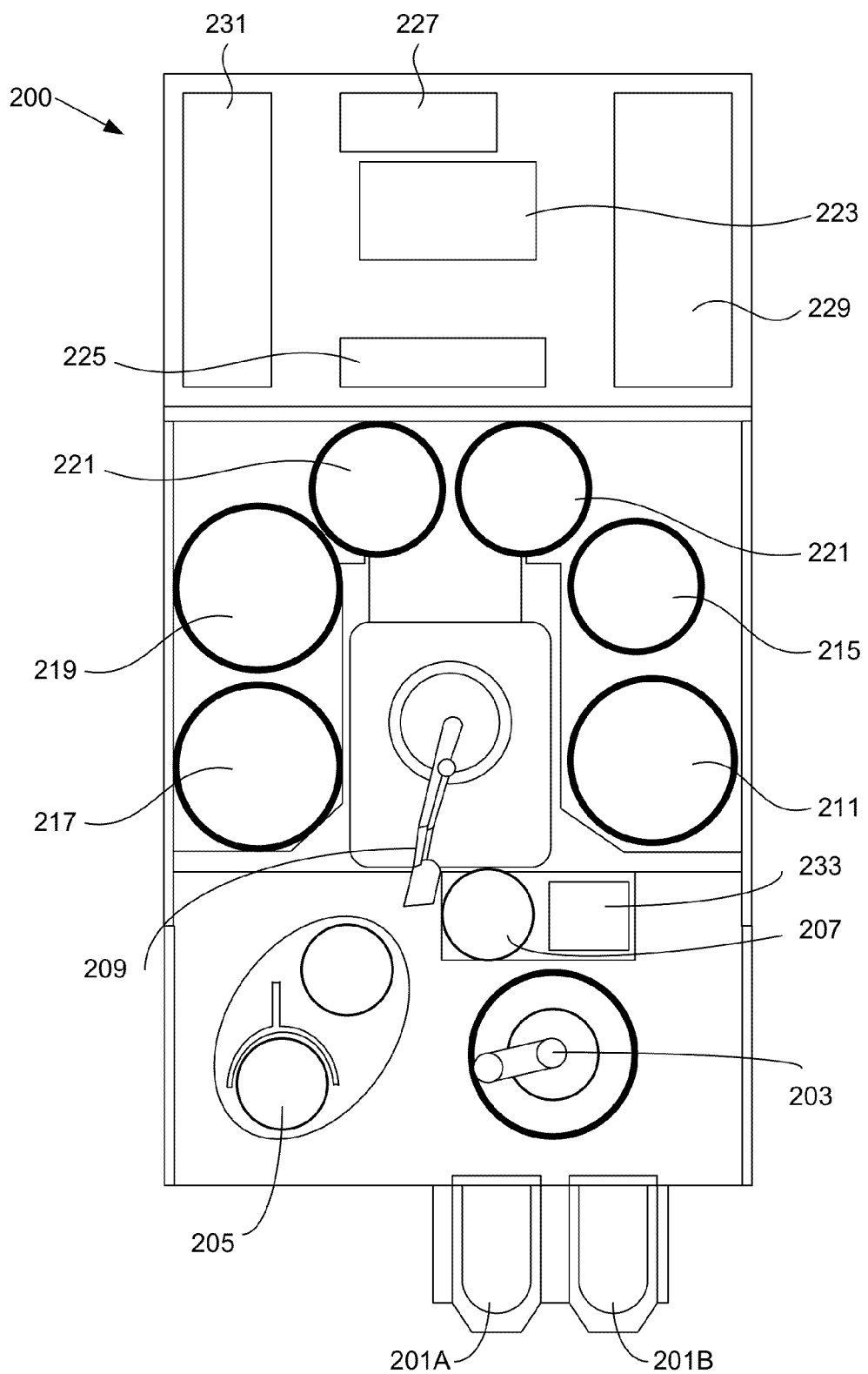
FIG. 2 is a graphical representation of a semiconductor processing apparatus in accordance with one embodiment.

General copper electroplating hardware and processes are discussed to provide context for embodiments disclosed herein. FIG. 2 depicts an electroplating system 200. The system includes three separate electroplating or electroplating modules 211, 217 and 219. System 200 also includes three separate post electrofill modules (PEMs): 215 and two 221's. Each PEM may be employed to perform each of the following functions: edge bevel removal, backside etching, acid cleaning, spinning, and drying of wafers after they have been electroplated by one of modules 211, 217 and 219. System 200 also includes a chemical dilution module 225 and a primary electroplating bath 223. This is a tank that holds the chemical solution used as the electroplating bath in the electroplating modules. System 200 also includes a dosing system 227 that stores and delivers chemical additives for the plating bath. A chemical dilution module 225 stores and mixes chemicals to be used as the etchant in the post electrofill modules. A filtration and pumping unit 229 filters the plating solution for central bath 223 and pumps it to the electroplating modules. Finally, an electronics unit 231 provides the electronic and interface controls required to operate system 200. Unit 231 may also provide a power supply for the system.

The following operations are described in a context of an electroplated copper seed layer. When the copper seed layer is deposited using PVD or CVD, the first electroplating operation for the copper seed layer is not used. In operation, an atmospheric robot including a robot arm 203 selects wafers from a wafer cassette or FOUPs (front opening unified pods) such as a cassette 201A or a cassette 201B. Robot arm 203 may attach to the wafer using a vacuum attachment or some other attaching mechanism. The wafer may first be transferred to an annealing station 205 for a pretreatment anneal. Annealing station 205 may be a number of stacked annealing stations, e.g., five stacked stations. Annealing stations 205 may be arranged one right on top of each other, in separate stacks, or in other multiple station configurations. To ensure that the wafer is properly aligned on a transfer chamber robot arm 209 for precision delivery to an electrofill module, robot arm 203 transports the wafer to an aligner 207 after the anneal. In certain embodiments, aligner 207 includes alignment pins against which robot arm 203 pushes the wafer. When the wafer is properly aligned against the alignment pins, the robot arm 209 moves to a preset position with respect to the alignment pins. In other embodiments, the aligner 207 determines the wafer center so that the robot arm 209 picks up the wafer from the new position. It then delivers the wafer to an electrofill module such as electrofill module 211 where the copper seed layer is electroplated onto the wafer. Electrofill module 211 may employ electrolyte from a secondary bath (not shown).

After the seed layer electroplating operation completes, robot arm 209 removes the wafer from electrofill module 211 and transports it to one of the PEMs such as module 215. The PEM cleans, rinses, and dries the wafer. The wafer is then again picked up with robot arm 209 and placed in the transfer station 233. The transfer station may be a slot or a position from and to which robot arms 203 and 209 may pass wafers without going through the aligner 207. The robot arm 203 then moves the wafer from the transfer chamber, optionally to the cassette, or to one of the anneal stations 205 or to an anneal furnace for the post copper seed anneal. If the wafer is inserted into the cassette, it may be stored for anneal and bulk electroplating at a later time or simply moved to the anneal station. After the copper seed anneal in accordance with some embodiments disclosed herein, robot arm 203 moves the wafer back through the aligner 207 and transfer robot 209 to an electrofill module 217 or 219 for bulk electroplating. After the features are filled with copper, the wafer is moved to the PEMs 221. There, unwanted copper from certain locations on the wafer (namely the edge bevel region and the backside) is etched away by an etchant solution provided by chemical dilution module 225. The PEMs 221 also cleans, rinses, and dries the wafer.

After processing in post electrofill modules 221 is complete, robot arm 209 retrieves the wafer from the module and returns it to cassette 201A or 201B. A post electrofill anneal may be completed in system 200 or in another tool. In one embodiment, the post electrofill anneal is completed in one of the anneal stations 205. In other embodiments, dedicated annealing systems such as a furnace may be used. Then the cassettes can be provided to other systems such as a chemical mechanical polishing system for further processing.

In some embodiments, a semiconductor processing system may include an electroplating apparatus and an annealing furnace. The system may include one, two, or more separate controllers having instructions for controlling the electroplating process operations and the annealing process operations for electroplating a copper seed layer and annealing the copper seed layer, for example. One controller may control the electroplating apparatus and electroplating processes, and one controller may control the annealing furnace and the annealing processes, for example. The controllers may include one or more memory devices and one or more processors configured to execute the instructions so that the system can perform a method in accordance with the disclosed embodiments. Machine-readable media containing instructions for controlling process operations in accordance with the disclosed embodiments may be coupled to each of the controllers.

Suitable semiconductor processing tools include the Sabre System manufactured by Novellus Systems of San Jose, Calif., the Slim cell system manufactured by Applied Materials of Santa Clara, Calif., or the Raider tool manufactured by Semitool of Kalispell, Mont.

Figure 3A:
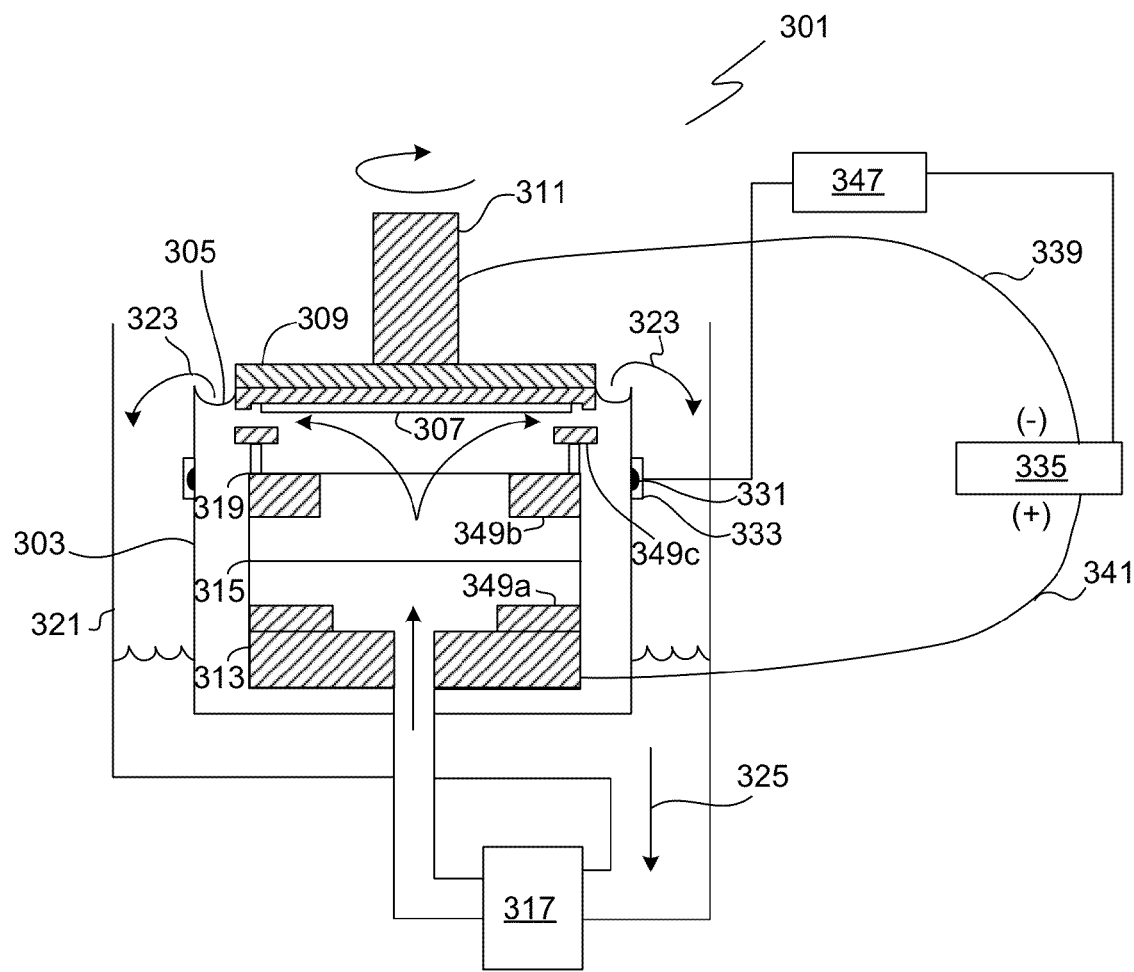
FIG. 3A is a diagrammatic cross-sectional view of one embodiment of an electroplating apparatus.

Referring to FIG. 3A, a diagrammatical cross-sectional view of an electroplating apparatus 301 is shown. The plating vessel 303 contains the plating solution, which is shown at a level 305. A wafer 307 is immersed into the plating solution and is held by, e.g., a "clamshell" holding fixture 309, mounted on a rotatable spindle 311, which allows rotation of clamshell 309 together with the wafer 307. A general description of a clamshell-type plating apparatus having aspects suitable for use with this embodiment is described in detail in U.S. Pat. No. 6,156,167 issued to Patton et al., and U.S. Pat. No. 6,800,187 issued to Reid et al., which are incorporated herein by reference for all purposes. An anode 313 is disposed below the wafer within the plating bath 303 and is separated from the wafer region by a membrane 315, preferably an ion selective membrane. The region below the anodic membrane is often referred to as an "anode chamber." The ion-selective anode membrane 315 allows ionic communication between the anodic and cathodic regions of the plating cell, while preventing the particles generated at the anode from entering the proximity of the wafer and contaminating it. The anode membrane is also useful in redistributing current flow during the plating process and thereby improving the plating uniformity. Detailed descriptions of suitable anodic membranes are provided in U.S. Pat. Nos. 6,126,798 and 6,569,299 issued to Reid et al., both incorporated herein by reference for all purposes.

The plating solution is continuously provided to plating bath 303 by a pump 317. Generally, the plating solution flows upwards through an anode membrane 315 and a diffuser plate 319 to the center of wafer 307 and then radially outward and across wafer 307. The plating solution also may be provided into anodic region of the bath from the side of the plating cell 303. The plating solution then overflows plating bath 303 to an overflow reservoir 321 as indicated by arrows 323. The plating solution is then filtered (not shown) and returned to pump 317 as indicated by arrow 325 completing the recirculation of the plating solution. In certain configurations of the plating cell, a distinct electrolyte is circulated through the portion of the plating cell in which the anode is contained and mixing with the main plating solution is prevented using sparingly permeable membranes or ion selective membranes.

A reference electrode 331 is located on the outside of the plating vessel 303 in a separate chamber 333, which chamber is replenished by overflow from the main plating vessel. A reference electrode is typically employed when electroplating at a controlled potential is desired. The reference electrode may be one of a variety of commonly used types such as mercury/mercury sulfate, silver chloride, saturated calomel, or copper metal. In the context of this disclosure, voltages applied to the wafer are expressed relative to the copper metal reference electrode.

A DC power supply 335 can be used to control current flow to the wafer 307. The power supply 335 has a negative output lead 339 electrically connected to wafer 307 through one or more slip rings, brushes and contacts (not shown). The positive output lead 341 of power supply 335 is electrically connected to an anode 313 located in plating bath 303. The power supply 335 and a reference electrode 331 can be connected to a controller 347, which allows modulation of current and potential provided to the elements of electroplating cell. For example, the controller may allow electroplating either in galvanostatic (controlled current) or potentiostatic (controlled potential) regime. The controller may include program instructions specifying current and voltage levels that need to be applied to various elements of the plating cell, as well as times at which these levels need to be changed. For example, it may include program instructions for transitioning from forward current (depositing copper) to reverse current (removing copper) or from potential-control to current-control upon complete immersion of the wafer into the plating bath or at some later time.

During a forward current pulse, the power supply 335 biases the wafer 307 to have a negative potential relative to anode 313. This causes an electrical current to flow from anode 313 to the wafer 307, and an electrochemical reduction (e.g., $Cu2++2\ e^-=Cu^0$) occurs on the wafer surface (the cathode), which results in the deposition of the electrically conductive layer (e.g. copper) on the surfaces of the wafer. During a reverse current pulse, the opposite is true. The reaction on the wafer surface is an oxidation (e.g., $Cu^0 \rightarrow Cu2++2\ e^-$), which results in the removal of the copper.

A first electroplating operation (i.e., electroplating a copper seed layer) of the process is discussed generally below. Further details of the two-step cooper electroplating process may be found in U.S. patent application Ser. No. 11/682,175, titled "TWO STEP PROCESS FOR UNIFORM ACROSS WAFER DEPOSITION AND VOID FREE FILLING ON RUTHENIUM COATED WAFERS," filed on Mar. 5, 2007, the disclosure of which is hereby incorporated by reference in its entirety for all purposes.

Electroplating the Copper Seed

As discussed above, deposition thickness varies between the edge and the center of the wafer when electroplating onto a thin film having a high sheet resistance. Ways to reduce the terminal effect include different configurations of the plating apparatus, discussed in more detail in the bulk electroplating section. These hardware configurations may also be used during the seed layer deposition. Yet another way to decrease this effect is to increase the resistivity of the electrolyte so that the relative change in potential between the wafer center and wafer edge compared to the overall potential drop through the plating cell becomes small. A special electrolyte, therefore, may be used for plating a seed layer of copper onto a ruthenium-coated wafer or a wafer including a thin ruthenium layer on a surface of the wafer.

Copper plating electrolytes commonly use a copper salt as ion source. The anions from the salt used can contribute significantly to conductivity of the solution. One factor affecting the conductivity of the electrolyte is the mobility of the ions. A copper salt having larger ions in solution would be less mobile, and the solution less conductive. Suitable salts include copper citrate ($Cu_3(C_6H_5O_7)_2$), copper pyrophosphate ($Cu_2P_2O_7$), and copper oxalate ($CuC_2O_4$). In general, molecular ions which are highly hydrated or which have more than 6 non-hydrogen atoms are sufficiently large to reduce the mobility of the ion in solution and are considered sufficiently large to reduce the conductivity of the electrolyte compared to the effect of equivalent concentration of small highly mobile ions such as hydrogen. As explained more fully below, the electrolyte composition may be tailored to mitigate corrosion of the semi-noble metal on the wafer. Depending on the semi-noble metal, this may involve adjusting the pH to a level that does not significantly attack the metal, including a compound that promotes reduction at the metal, and/or excluding agents that attack the metal (e.g., excluding molecular oxygen and agents that complex ions of the metal).

In certain embodiments, the copper seed electrolyte has a resistivity of greater than about 200 ohm cm, or conductivity less than about 5 milliSiemens. In various further embodiments, the resistivity is about 200 to 5000 ohm cm, about 400 to 4000 ohm cm, or about 1000 to 2000 ohm cm. One skilled in the art will readily be able to choose a resistivity that allows a thickness distribution within a uniformity requirement on a given ruthenium film resistance using particular hardware configurations. A common uniformity requirement of thickness difference between the edge and the center of the wafer is a range of about +/−10%, or less than about +/−5%.

The electrolyte also includes one or more copper complexing agents. Complexing agents are additives that bind the copper cation in solution, thereby increasing the degree of polarization, or the potential required to reduce the cupric ion to metal. It is believed that the copper nucleation and growth mode is sensitive to the oxidation state of the ruthenium surface. Because ruthenium is deposited in a different process (PVD or ALD) with different semiconductor processing tools, the surface is usually covered with an air-formed oxide film. Failure to remove the air-formed 3D oxide film may result in Volmer-Weber (island) growth on the surface. In order to achieve continuous copper nucleation in the electroplating bath, the surface film must be removed by polarization at negative potentials typically in or approaching the hydrogen evolution region.

A suitable complexing agent is ethylenediaminetetraacetic acid (EDTA). EDTA is a hexadentate (six-toothed) ligand, i.e., it has 6 lone pairs of electrons all of which can form coordinate bonds with the same metal ion. EDTA forms extremely stable complexes with divalent metal cations using all of its complexing sites that give rise to a cage-like structure in which the cation is effectively surrounded by and isolated from solvent molecules. A consequence of the stronger complexing ability of EDTA is that a larger cathodic potential is required for the reduction of cupric ions to copper metal (range of about 0.8V to 1.8 V). Such extreme negative copper reduction potential may also reduce the oxide film on ruthenium resulting in continuous nucleation on the surface. If the electrolyte contains no complexing agent, copper will deposit at much lower cathodic potentials (about 0.6 V). The oxide film will not be removed and poor nucleation would result with the attending effect of rapid growth on initially formed nuclei. Therefore, the plating reaction in accordance with some embodiments deposits copper at a potential that is about 0.2 to 1 V more cathodic than would occur in a conventional copper-plating electrolyte.

Other suitable complexing agents include citrate, pyrophosphate, oxalate, and a combination of the aforementioned complexing agents. Incorporating these complexing agents would also increase the cathodic potential and thereby remove the oxide film on ruthenium. Other complexing agents include triethanolamine, dimercaptosuccinic acid, nitrilotriacetate, dimercaprol, and defuroxamine mesylate. Using the electrolyte as described, the copper plating reaction occurs at a cathodic potential of about 0.8 to 2.0 V.

In some embodiments, the electrolyte comprises about 0.004 to 0.007M EDTA and about 0.004 to 0.007M copper citrate. The electrolyte may have a pH of about 2 to 6. In some embodiments, the electrolyte also includes a wetting agent.

In certain specific embodiments, an electrolyte that includes a copper salt and a copper complexing agent, (i) is substantially free of chemical species that are corrosive to the semi-noble metal layer and (ii) has a pH of about 8.5 to 13.5. The electrolyte being free of chemical species that are corrosive to the semi-noble metal layer and the electrolyte having a basic pH (i.e., a pH above 7) helps to avoid corrosion of the semi-noble metal layer being plated on, which may be very thin. In certain embodiments, the semi-noble metal layer may be nickel or cobalt, both of which are susceptible to corrosion by an electrolyte.

Chemical species that are corrosive to the semi-noble metal layer include a number of different compounds and elements. Certain copper complexing agents may be corrosive to the semi-noble metal layer. Such complexing agents include complexing agents that complex with elements that are included in the semi-noble metal layer. In certain embodiments, such complexing agents are purposely excluded from the electrolyte. In other embodiments, halides such iodine and chlorine, which are corrosive to the semi-noble metal layer, are excluded from the electrolyte. In further embodiments, oxygen is excluded from the electrolyte. Molecular oxygen can be highly corrosive to certain semi-noble metal layer. Oxygen can be substantially removed from and/or prevented from being dissolved in the electrolyte using a degassing device or a vacuum degassing device, by flowing gasses (e.g., nitrogen or hydrogen) through the electrolyte, or by blanketing the electrolyte with an inert gas (e.g., nitrogen). Examples of commercially available degassing devices include the Liquid-Cel™ from Membrana of Charlotte, N.C. and the pHasor™ from Entegris of Chaska, Minn. Decreasing the dissolved oxygen levels in the electrolyte to less than about 1 ppm has also been shown to result in improved copper nucleation on semi-noble metal layers.

The electrolyte may also include a corrosion inhibiting agent. Some corrosion inhibiting agents produce a reducing potential at the semi-noble metal layer surface. Examples of corrosion inhibiting agents include formaldehyde, glyoxylic acid, hydrazine, dimethylamine borane, and sodium hypophosphite.

Figure 3B:
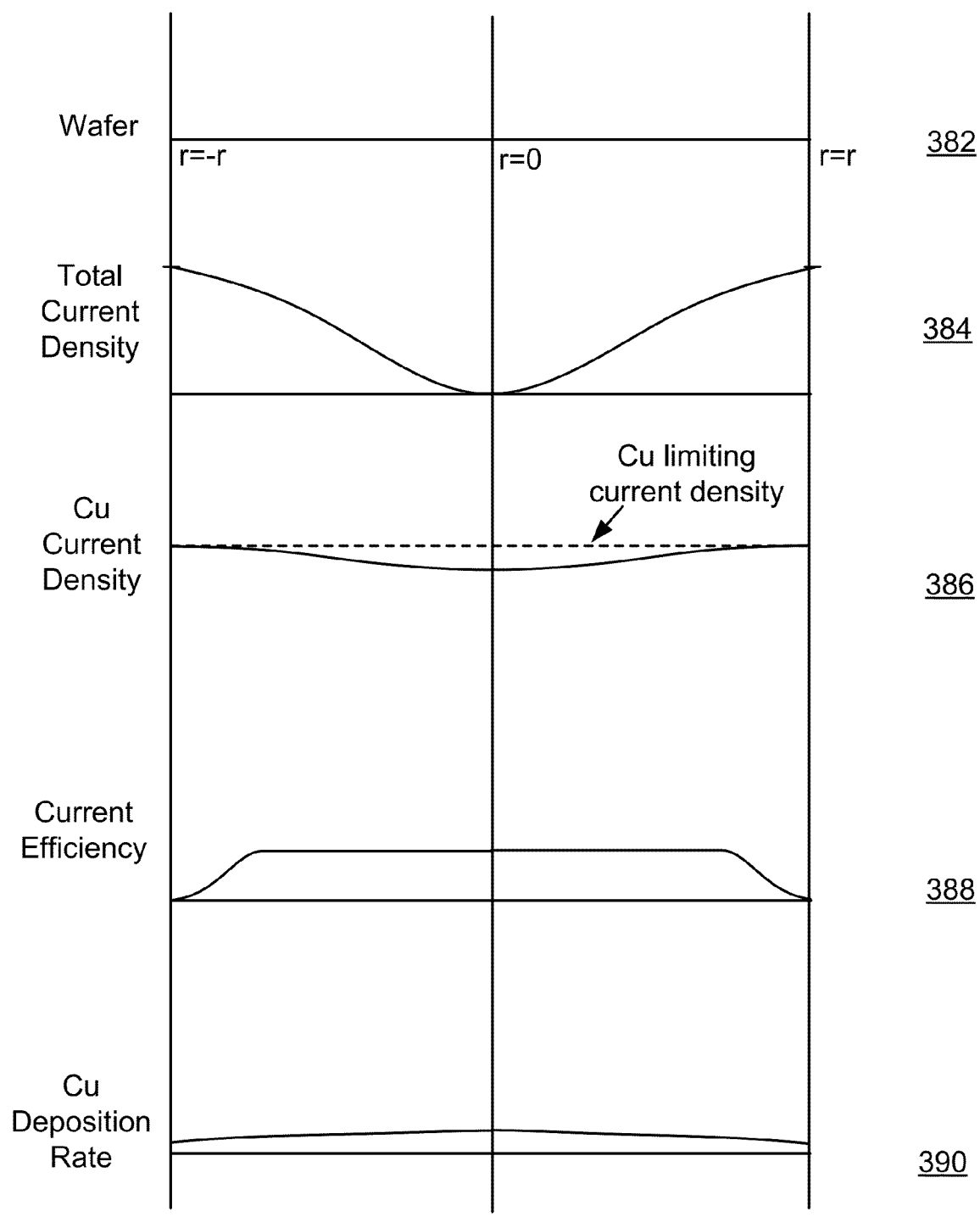
FIG. 3B is a diagram depicting the effect of current density on the copper seed layer deposition rate.

In certain embodiments, the terminal effect is mitigated or eliminated by adjusting the potential or current applied to edge of the wafer (that in turn affects the current density across the wafer) such that current efficiency varies across the face of the wafer. This may be accomplished by adjusting the overall potential or current applied to the wafer such that the current density approaches or surpasses the copper limiting current density at or near the edge of the wafer. In some embodiments, the current density surpasses the limiting current density at a point between the edge of the wafer and the center of the wafer. The relationship between current density and copper deposition rate is shown in FIG. 3B. In FIG. 3B, line 382 represents a wafer with the wafer center at radius=0 and the wafer edges at radius=r. As explained herein, electrical contact is made at the wafer edges, and for a high sheet resistance semi-noble metal layer (which may be partially covered with a partial copper seed layer), the voltage drops from the edges of the wafer to the center. Applying a potential to the edge of the wafer causes copper to electrodeposit onto the wafer at different radially varying current densities.

The total current density of an electroplating process is the amperage of the electroplating current divided by the surface area of the semiconductor wafer. As noted above, the current density may vary across the surface of the wafer, as shown in 384. Generally, the higher the current density, the faster the copper electrodeposition rate. Due to the higher potential at the edges of the wafer, the current density at the edges of the wafer is higher than the current density at the center of the wafer, yielding the concave copper thickness profile, as described herein.

In typical copper plating configurations, the reduction of copper (II) ions to metallic copper is responsible for all or nearly all of current density at the wafer surface. Thus, the contribution of copper reduction to the total current density roughly tracks the current density, but this is true only up to a certain point, beyond which the copper current density cannot increase even if the potential or total current applied to the wafer is increased significantly. This maximum contribution of the copper reduction reaction to current density is termed the copper limiting current density. When the cell's total current density exceeds the copper limiting current density, current density in excess of the copper limiting current is manifest as parasitic electrochemical reactions, such as the electrolysis of water. The copper current density across the wafer when the copper current density has been exceeded is shown 386.

Current efficiency is the percentage of total current which is actually used for the copper deposition at the cathode (i.e., the current not including current used for in parasitic electrochemical reactions). When the copper current density for copper deposition exceeds the copper limiting current density, the current efficiency decreases because current that is not being used for copper deposition is consumed by the parasitic electrochemical reactions, as shown in 388. When operating at total currents where the copper's limiting current density is exceeded at the edge of the wafer but not the center, the terminal effect is compensated. As more total current is applied in this regime, the copper deposition rate increases in the center of the wafer relative to the edge of the wafer. Some this additional current can be used for copper deposition in the center of the wafer but not the edge. Thus, by increasing the potential or current applied at the edges of the wafer, the current efficiency profile of the copper deposition process may be varied. In some embodiments, the current efficiency at the edge of the wafer is about 20 to 30% and the current efficiency at the center of the wafer is about 50 to 60% or even higher. This mitigates the terminal effect, resulting in a more even copper seed layer deposition rate across the wafer surface, as shown in 390, and ultimately results in an about 30 to 40% improvement in the thickness uniformity of the copper seed layer deposited across the face of the wafer.

In summary, the electrolytic seed deposition process may be conducted in a regime where the local current density is at or above the limiting current density of copper reduction at the edge of the wafer. This produces a current efficiency profile that varies radially over the face of the wafer. The copper current efficiency drops off rapidly for current densities in excess of the copper limiting current density. The combination of electrolyte composition and total current to the wafer can be tailored to operate in this regime and provide a more uniform copper deposition profile in situations where the terminal effect, if unmitigated, would produce a highly non-uniform deposition profile.

A similar reduction in the terminal effect can also be accomplished by reducing the mass transfer of copper ions, without necessarily reaching the limiting current density, near the edge of the wafer to the point that the electroplating process is mass transfer limited in that region, as described in U.S. Pat. Nos. 6,110,346, 6,162,344, and 6,074,544, which are incorporated herein by reference.

In certain embodiments, a copper alloy seed layer is deposited on the semi-noble metal layer using an electroplating process. The copper alloy may be, for example, an alloy of copper with chromium, iron, cobalt, nickel, zinc, ruthenium, rhodium, palladium, silver, indium, tin, tellurium, platinum, gold, or lead. The copper alloy may include one or more of these alloying elements. In various embodiments, the copper alloy seed layer includes about 0.1 to 5 weight percent of an alloying element or elements. As explained below, the alloying element may provide some protection against damage resulting from electromigration.

Typically, the electrolyte used during the electrodeposition of a copper alloy seed layer includes a copper salt, a copper complexing agent, and a salt of an alloying element. In various embodiments, the alloying element has an atomic mass of about 50 to 210. The concentrations of the copper salt, the copper complexing agent, and the salt of the alloying element may be at specified levels to yield a defined composition of the copper alloy seed layer. In some embodiments, the concentration of the copper salt and salt of the alloying element are at levels that yield a defined composition of the copper alloy seed layer. For instance, the copper salt may have a concentration of about 0.001 to 0.01 M and the salt of the alloying element may have a concentration of about 0.000001 to 0.05 M. In other embodiments, the concentration of the copper complexing agent in the electrolyte is at a level that yields a defined composition of the copper alloy seed layer. For instance, the copper complexing agent may have a concentration of about 0.001 to 0.01 M. In further embodiments, the electrolyte further includes a complexing agent for complexing the alloying element. The concentrations of both the copper complexing agent and the complexing agent for complexing the alloying element may be at levels that yield a defined composition of the copper alloy seed layer. The structures of the respective complexing agents also help in dictating the composition of the seed layer. The choice of complexing agent for a given metal ion will influence the deposition rate at a given potential. Each complexing agent will shift the deposition potential for the ion negative of the deposition potential for the uncomplexed ion. Thus, the choice of complexing agents for one or both the copper ion and the alloying element will influence the relative deposition rates of copper and the alloying element. In some embodiments, the complexing agent is the same for both the copper ion and the alloying element is the same complexing agent; i.e., one complexing agent complexes both the copper ion and the alloying element. In some embodiments, the electrolyte has a pH of about 2 to 12. In general, the amount of alloying element in the seed layer is dependent on the fraction of the total current at the wafer surface that is attributable to reduction of copper ions and the fraction attributable to reduction of the alloy element ions. This is, in turn, dependent on, inter alia, the total current to the wafer, the ionic concentrations of the alloying element and copper, and the choice of complexing agent(s). In specific embodiments, the current density attributable to copper reduction is between about 50 and 5000 times the current density attributable to reduction of the alloying element(s).

Specific examples of electrolyte compositions for depositing a copper alloy seed layer, the copper alloy being copper-silver or copper-cobalt, are given below. In an embodiment for depositing a copper-silver alloy seed layer, the electrolyte includes about $5 \times 10^{-3}$ M copper salt, about $5 \times 10^{-3}$ M complexing agent, and about $1 \times 10^{-6}$ M to $1 \times 10^{-3}$ M silver salt. The copper salt may be copper citrate, the complexing agent may be EDTA, and the silver salt may be silver sulfate or silver nitrate. In an embodiment for depositing a copper-cobalt alloy seed layer, the electrolyte includes about $5 \times 10^{-3}$ M copper salt, about $5 \times 10^{-3}$ M complexing agent, and about $1 \times 10^{-4}$ M to $1 \times 10^{-2}$ cobalt salt. The copper salt may be copper citrate, the complexing agent may be EDTA, and the cobalt salt may be cobalt citrate. The pH of the electrolyte for depositing a copper-cobalt alloy seed layer may be about 3 to 12. The incorporation of an alloying element in a copper seed layer is dependent on the concentration of the alloying element ion along with the operating conditions (e.g., current density and mass transfer).

As explained herein, after depositing a copper alloy seed layer on the semi-noble metal layer using an electrolyte, a bulk-layer of copper is deposited on the copper seed layer, which is a copper alloy in the present embodiment, using a different electrolyte. The electrolyte used to deposit the bulk-layer of copper is further described, below.

In some embodiments, after depositing the bulk-layer of copper, the bulk-layer of copper and the copper alloy seed layer are treated to cause at least some of the alloying element to move into the bulk-layer. In some embodiments, the treatment is a heat treatment. The heat treatment may be performed in an annealing station of a semiconductor processing apparatus. The annealing station may be located on the same apparatus that is used to deposit the copper alloy seed layer and the bulk-layer of copper. Alternatively, the heat treatment may be performed as part of a subsequent processing step in the semiconductor fabrication process. For example, during the subsequent deposition of a dielectric layer, the wafer, the bulk-layer of copper, and the copper alloy seed layer are subjected to elevated temperatures, which may act as a heat treatment. Still further, the heat treatment may be performed in a separate furnace.

In some embodiments, the treatment causes the alloying element to move (e.g., via diffusion) into the bulk-layer of copper and to a top surface of the bulk-layer of copper. The alloying element being located at the top surface of the bulk-layer of copper serves to decrease the electromigration of copper, increasing the electromigration life of the semiconductor device. In further embodiments, the semiconductor wafer is planarized to produce a top surface after depositing the bulk-layer of copper but prior to performing the treatment.

Figure 3C:
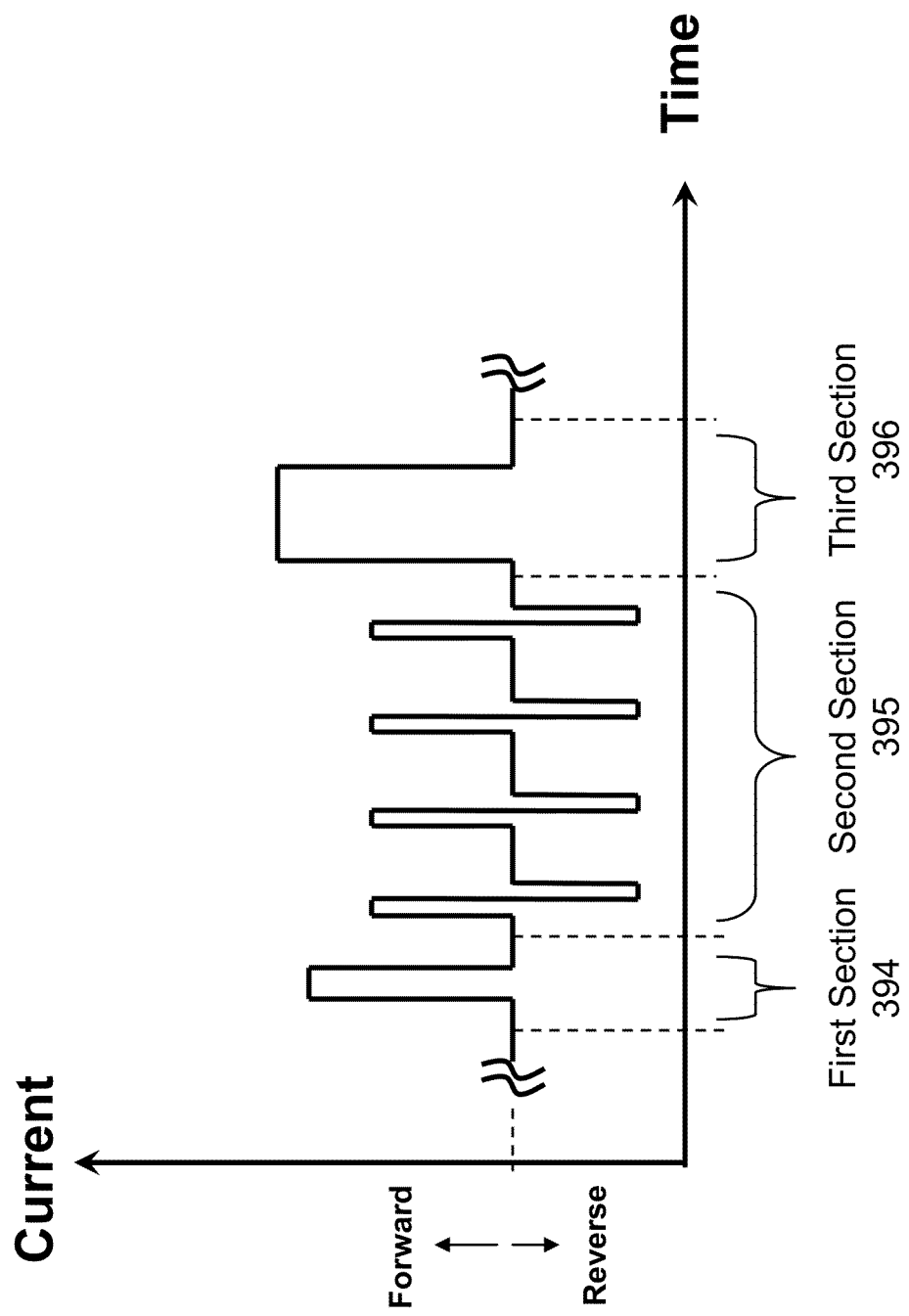
FIG. 3C is a plot of current versus time for one embodiment of the copper seed layer electroplating process.

During the copper seed deposition, the power supply 335 applies a direct current to flow between the anode 313 and the wafer 307. In some embodiments, the current waveform has three sections or regimes. These three sections or regimes are shown in a plot of current versus time in FIG. 3C. The first section (394) is a forward current pulse of a first current for a first duration. The second section (395) is pairs of alternating forward and reverse current pulses for a second duration. The third section (396) is another forward current pulse for a third duration.

During the first section, some copper is plated onto the wafer. During the second section, copper is alternatively plated onto the wafer and removed from the wafer. It is found that this alternating deposition and removal greatly improves nucleation and coverage. The better coverage reduces the resistivity of a given thickness of copper deposited. During the removal pulse in a pulse pair, substantially all of the copper deposited during the forward pulse is removed (e.g., at least about 50% or at least about 80% of the previously deposited copper). One skilled in the art will be able to select a waveform that achieves this goal while taking into account the differences between current efficiency of the forward and reverse current pulses. In general, the forward current (deposition) is less efficient than the reverse current (removal). Care also must be taken not to over polish the surface.

After the second step, the wafer may have little or no copper deposited, as each pulse pair removes the copper it deposits. Substantially all of the copper seed layer is deposited during the third regime. In the third regime, a forward current is applied for a third duration to deposit the about 15 to 60 angstrom seed film thickness.

In some embodiments using a 300 mm wafer, in the first step, the forward current may be about 0.6 to 1.0 amps for a period of about 0.5 to 2 seconds. The second step 203 may include forward current pulses of about 0.6 to 0.9 amps for a period of about 700 to 1500 milliseconds and include reverse current pulses of about 0.2 to 0.5 amps for a period of about 400 to 600 milliseconds. The entire duration of the second step may be about 8 to 15 seconds, for a total of about 5 to 15 pulse pairs. In the third step, the current may be about 0.6 to 1.0 amps for a period of about 10 to 22 seconds. Depending on the thickness of the seed layer required, one skilled in the art would determine the appropriate duration given the current flow and other electroplating process parameters.

Although a three-section waveform is described, embodiments disclosed herein are not limited to such a waveform. For example, a waveform with fewer or more sections may be applied, with or without a section of forward and reverse pulse pairs. Thus, a much simpler waveform having only forward direct current may be used.

In further embodiments, forward and reverse current pulses are applied to the semi-noble metal layer in an electrolyte to treat the metal layer. As described herein, this treatment greatly improves copper seed layer nucleation and coverage. In specific embodiments, the current efficiency of a forward current pulse is about 40 to 80%. The copper current efficiency, as explained above, is the percentage of current which is actually used for copper deposition at the cathode (i.e., the current not including current used for the side reactions). In some embodiments, the forward current pulse deposits about 0.25 to 2.5 monolayers of copper (or alloy) on the metal layer. In further embodiments, the forward current passed in the forward current pulse is about 0.3 to 2 Coulombs. The current efficiency of a reverse current pulse is typically greater than about 80%, and strips off substantially all of the copper deposited during the forward current pulse. In this treatment of the metal layer, more copper could be deposited on the metal layer with a forward current pulse and then stripped off with a reverse current pulse. This, however, is inefficient, as it is likely that the improved copper seed layer nucleation and coverage results from depositing a thin layer of copper on the semi-noble metal layer and then stripping it off (i.e., pretreating the semi-noble metal layer). After treatment of the semi-noble metal layer, a copper seed layer is deposited on the metal layer using the electrolyte in an electroplating process.

In some embodiments of this semi-noble metal treatment process, the electrolyte comprises a copper salt at a concentration of 0.001 to 0.01 M. In other embodiments, the electrolyte comprises a copper salt and a copper complexing agent. In further embodiments, the pH of the electrolyte is about 2 to 6. The electrolyte used during the pretreatment process may be the same or different from that used in the seed layer deposition process.

As discussed above, a thin conformal copper film about 15 to 60 Angstroms may be deposited as the seed layer. The minimum thickness is determined by sheet resistance of the resulting surface, the whether continuous coverage is obtained on the semi-noble surface and the need to avoid full oxidation of the copper seed layer before the bulk-plating step. The oxidation factor may be controlled by reducing the time between the seed and bulk plating step and the exposure to oxygen in the environment in between electroplating steps. If the sheet resistance becomes too high the bulk electroplating may not be possible. The maximum thickness depends on the geometry of the features on the wafer. A reasonably low aspect ratio is required prior to the bulk plating. Generally, an aspect ratio of less than about 15, or less than about 10 in some embodiments, is required prior to the bulk plating. A higher aspect ratio increases the probability that a feature opening would be pinched off leaving unfilled voids. The ability to deposit very thin seed layers onto very thin barrier layers enables filling of features 25 nm and below. A separate bulk layer electroplating is necessary because the seed layer deposition is very slow.

Depositing the Copper Seed Layer by PVD

Two main types of PVD apparatus, hollow cathode magnetron (HCM) and planar magnetron, are used to deposit a copper seed layer. They are briefly described herein. Hollow cathode magnetron is an apparatus carrying a three-dimensional sputter target. Embodiments disclosed herein are not limited to a specific cup-like geometry of an HCM target and can be used in conjunction with three-dimensional targets of a plurality of shapes. An INOVA™ tool commercially available from Novellus Systems, Inc. (San Jose, Calif.), which includes an HCM sputtering source, is an example of a suitable tool for such deposition.

Figure 4A:
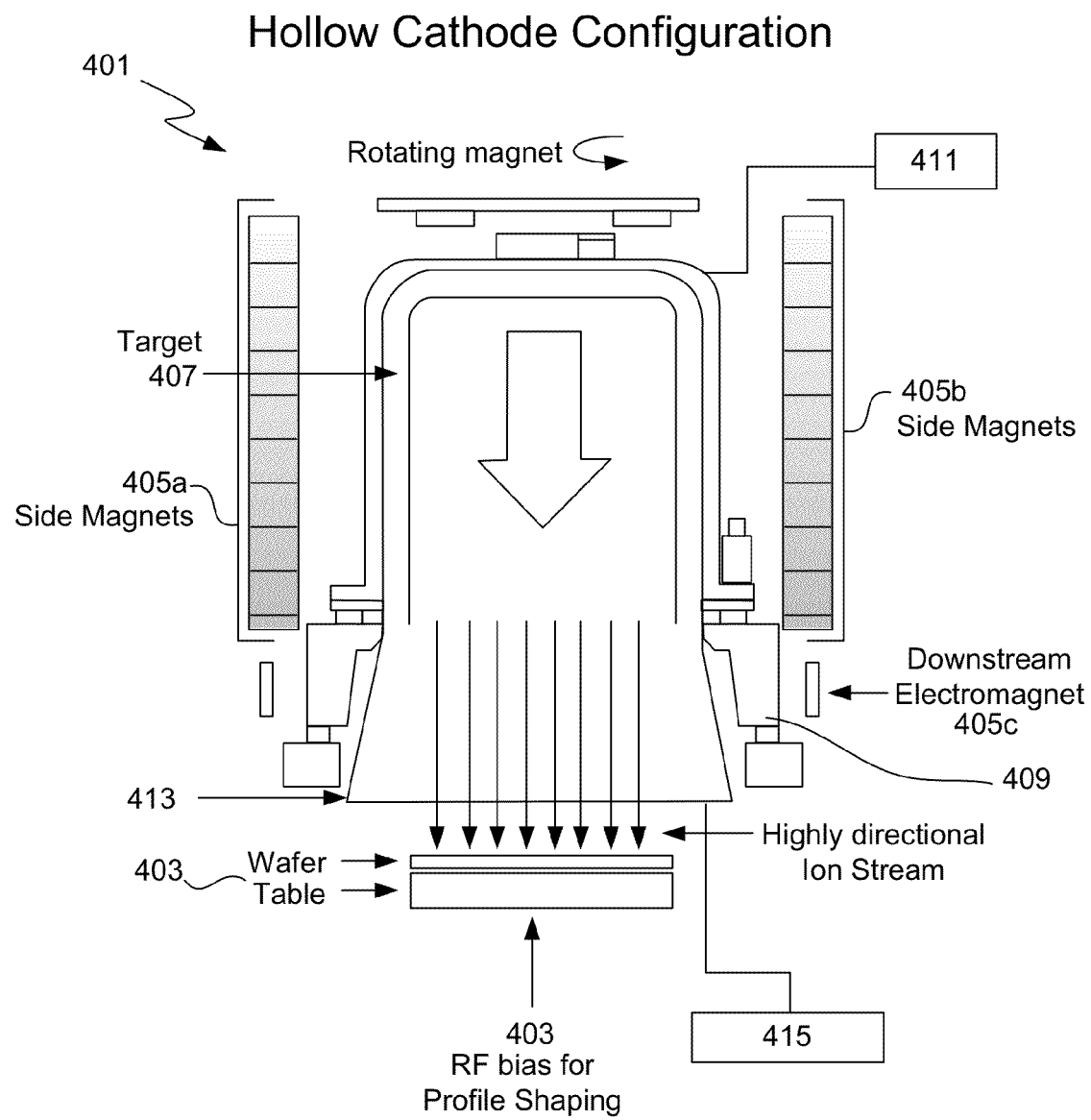
FIG. 4A is a cross sectional depiction of the hollow cathode magnetron (HCM) apparatus suitable for depositing PVD copper seed.

FIG. 4A presents a cross sectional view of one type of HCM sputtering apparatus that can be used in accordance with some embodiments. The HCM apparatus has two main components, the source 401, in which a plasma is created and maintained, and the RF bias electrostatic chuck (ESC) pedestal 403, which secures the wafer and applies an RF bias on the wafer, if needed. In this example, the source 401 contains several electromagnets 405a-405c, a cathode target 407, and a shield 409, often referred to as an anode. The cathode target 407 generally has a hollow cup-like shape so that plasma formed in the source can be concentrated within this hollow region. The cathode target 407 also serves as a sputter target and is, therefore, made of copper, which is to be deposited onto a substrate.

An inert gas, such as neon, krypton, argon, or xenon, more typically argon, is introduced through a gas inlet 413 into the hollow region of the cathode target 407 powered by a DC source to form a plasma. Inert gas ions formed in a plasma are then directed towards the target and upon collisions with the target, sputtering of target metal occurs. The sputtered metal, which may be ionized or neutral, is deposited onto the exposed surfaces of a substrate forming a layer of metal.

The pump 415 is positioned to evacuate or partially evacuate the process chamber. The control of pressure in the process chamber can be achieved by using a combination of gas flow rate adjustments and pumping speed adjustments, making use of, for example, a throttle valve or a baffle plate. Alternatively, pressure above the wafer can be controlled by varying the height of the wafer pedestal 403. At an increased pedestal height, slower gas flow results in a higher pressure above the wafer.

An intense magnetic field is produced by electromagnets 405a-405b within the cathode target region. Additional electromagnets 405c are arranged downstream of the cathode target so that different currents can be applied to each electromagnet, thereby producing an ion flux and a controlled deposition and/or etch rate and uniformity. A floating shield 409, existing in equilibrium with the floating plasma potential, is used, in conjunction with the source electromagnets to shape the plasma distribution at the target mouth. A stream of ions is directed to the surface of the wafer, as shown by arrows on FIG. 4A. The ESC pedestal 403 holds the wafer substrate in place and can apply a RF bias to the wafer substrate. The ion energy, and therefore the deposition and/or etch rate can also be controlled by the pedestal RF bias. An additional function of the ESC pedestal is to provide wafer temperature control during deposition and resputtering. In a typical process the pedestal temperature can vary in the range of about −50 to 600° C. In practice it is often advantageous to cool the wafer pedestal down to temperatures of about −40 to −20° C. while the shields of an apparatus are kept at a higher temperature of about 25 to 500° C., about 100 to 200° C. in some embodiments. Typically, argon or helium backside gas is used to provide thermal coupling between the substrate and the ESC.

Depending on the desired result, deposition conditions may be adjusted to tune the amount of neutral or ionized metal during deposition and to tune the directionality of copper particles approaching the wafer. For example, in some embodiments, conditions may be adjusted to direct a flux of copper ions at a normal towards the wafer surface. The conditions may be further adjusted to minimize deposition effected by neutral copper particles, which usually do not have a preferred direction when they approach the substrate. When copper ions approach the substrate at a 90° angle, horizontal surfaces, such as via bottoms, trench bottoms, and field regions are predominantly covered. Under such deposition conditions, the thickness of deposited metal layer is high on horizontal surfaces and is low on the sidewalls of the recessed features. These conditions also minimize undesired overhang at the recess openings. The substrate includes a via and a trench formed in a layer of dielectric. The surface of the wafer is lined with a layer of semi-noble metal. A layer of copper is being deposited onto the exposed diffusion barrier. During deposition of the layer of copper, copper ions approach the substrate at a 90 degree angle and are deposited to form a layer of copper. It can be seen, that under these deposition conditions thickness of copper layer on the feature sidewalls is substantially smaller than the thickness of copper layer at the feature bottoms and in the field. Such deposition regime is often preferable, since it minimizes overhang formation, but may produce spotty coverage on the sidewalls.

In other embodiments, deposition of the copper may include a substantial amount of deposition effected by metal particles (neutral or ionized) that approach the substrate at angles other than 90°. When amount of such off-angle deposition is increased, the coverage of via bottoms is decreased, while deposition in the field, and in the low-aspect ratio features, such as on the sidewalls and bottoms of trenches is increased. In some embodiments, the first metal layer is deposited under conditions that can generate overhang at the openings of the recessed features. Such overhang can be subsequently removed and/or reshaped using metal redistribution, such as resputtering.

Generally, a wide range of conditions corresponding to a variety of deposition regimes can be used during deposition of the copper seed layer. For example, deposition can be performed under a pressure of about 0.05 to 20 mTorr and at a wafer temperature of about −50 to +75° C. In certain embodiments, it is preferable to use pressure that is less than about 1 mTorr. During deposition, the target power can be set within a range of about 10 to 80 kW. The substrate may be biased or unbiased. The RF bias power may range from about 0 to 3000 W. It is understood, that different PVD systems may require different values of process parameters, and the above ranges are provided as an illustration of one embodiment. In other embodiments, temperature, pressure and power ranges may differ from those presented above. In those embodiments where increased coverage of via bottoms is desirable, the conditions are typically adjusted to increase the amount of highly directional metal particles approaching the wafer at a 90° angle. According to some embodiments, such deposition conditions can be achieved using a target power that is set to a value ranging from about 35 to 75 kW, e.g., about 50 to 75 kW, and an RF bias power ranging from about 100 W to 500 W. The preferred pressure used in this particular embodiment is less than about 1 mTorr. In other embodiments a highly directional metal flux may be achieved under different conditions, which depend on other parameters of the process, such as magnetic field, etc.

The controller may provide program instructions for implementing the seed layer deposition method. The instructions may control a variety of process parameters, such as DC power level, RF bias power level, pressure, temperature, and magnetic field. The instructions may control the parameters so as to run a deposition/resputter/deposition sequence according to certain PVD copper seed processes. For example, instructions may be provided for the following sequence: sputtering the metal from the target onto the semiconductor wafer under conditions that coat at least the bottom portions of the recessed features and the field regions; subsequently resputtering the deposited metal from the bottom portions of the recessed features to the sidewalls of the recessed features; and subsequently sputtering the metal from the target onto the semiconductor wafer to form a second layer of metal. In some embodiments the instructions may set the process parameters to remove at least about 50% of the metal layer thickness at the recess bottoms during the resputtering operations, or to remove about 20 to 50% of the metal layer thickness in the field. Further, the instructions may specify parameters that will lead to improved coating of corners located within the recessed features during deposition of the second layer of metal.

Figure 4B:
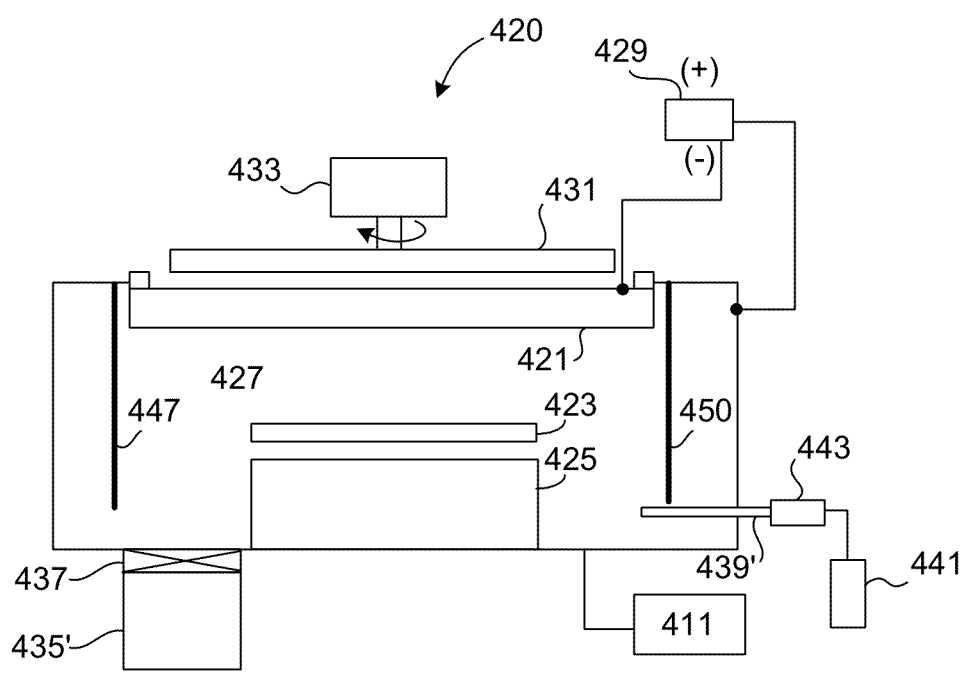
FIG. 4B is a cross sectional depiction of a planar magnetron suitable for depositing PVD copper seed.

According to some embodiments, the seed layer can be deposited using a planar magnetron. FIG. 4B shows a schematic representation of an example planar magnetron 420. Target 421, a circular, planar block of material to be deposited, is spaced from the wafer 423, which is mounted on a heating stage 425 in chamber 427. A DC power supply 429 is used to apply a DC field to target 421, establishing a plasma in the chamber below target 421. A circular magnet 431 mounted above the target is rotated by motor 433 setting up a magnetic field extending through target 421 into the region between the target 421 and wafer 423. Cryopump 435 connected to chamber 427 via valve 437 is used to evacuate the chamber. Process gas injector 439 is connected to process gas supply 441 via mass flow controller 443. A sputtering gas is introduced into chamber 427 via injectors 439. It is understood that the structure of module 420 is exemplary only. The methods of embodiments disclosed herein may be practiced in other types of planar magnetrons, such as ones having ICP sources.

Each apparatus described herein may include hardware for accomplishing appropriate process operations and also may include a system controller having instructions for controlling process operations in accordance with the disclosed embodiments. The system controller may include one or more memory devices and one or more processors configured to execute the instructions so that the apparatus can perform a method in accordance with the disclosed embodiments. Machine-readable media containing instructions for controlling process operations in accordance with the disclosed embodiments may be coupled to the system controller.

Annealing the Copper Seed Layer

Figure 5:
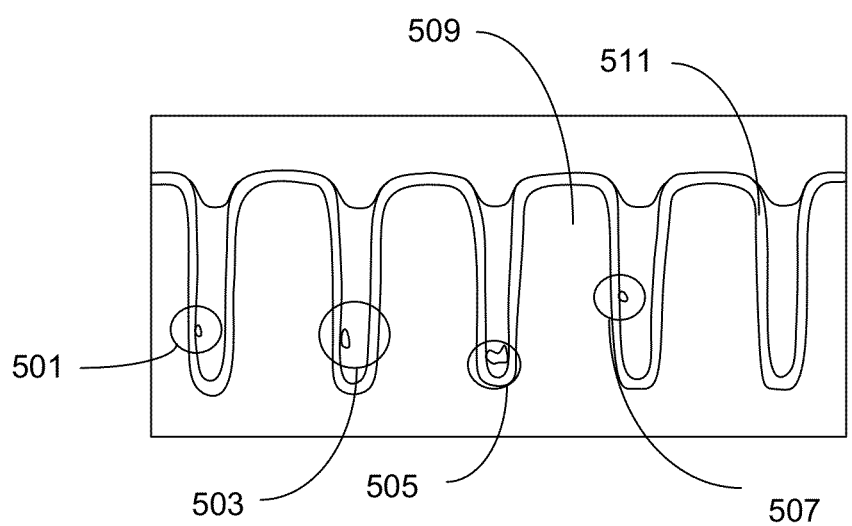
FIG. 5 is a graphical representation of a SEM photo of a copper metallization stack after a post electrofill anneal of the stack including annealed copper seed and unannealed copper seed layers deposited using electroplating processes.

After the copper seed layer is deposited, in some embodiments, it is annealed before a bulk layer is electroplated to fill the features. In some embodiment, the bulk layer is annealed before planarizing the bulk copper. The post electrofill anneal has been found to grow and stabilize grain structure in electroplated copper. Typical post electrofill anneal conditions range from about 100 to 225° C. for about 90 seconds to 1 hour. The bulk copper after the post electrofill anneal planarizes, e.g., chemical mechanical polishing, at a consistent rate and has a lower resistance and better electromigration lifetimes. However, the post electrofill anneal can result in void formation. The post electrofill anneal stresses the electroplated copper and causes voids to form at the copper-ruthenium interface. FIG. 5 is a graphical representation of a SEM photo of such voids, 501, 503, 505, and 507. These examples of voids are located at different places in the feature and have different sizes and shapes, but all of them appear to be formed at a copper-ruthenium interface.

The copper electroplating process includes an optional step of pretreating a ruthenium-coated wafer by annealing before any seed layer deposition takes place. Because the wafer may be already annealed before (pretreatment) and after electroplating (post electrofill anneal), an additional anneal after the copper seed layer electroplating was not considered. In most cases, the wafer is transferred directly to the bulk-electroplating module immediately after the seed layer deposition. In some cases, the wafers are stored. Under ambient conditions after some time, a layer of copper oxide forms on exposed copper surface. When exposed to the acidic environment in the bulk electroplating solution, the copper oxide dissolves into the electroplating solution. This dissolution is undesirable because it removes a portion of the copper seed layer that may render the copper seed layer discontinuous or bulk electroplating more difficult. By annealing the wafer in a reducing environment prior to the bulk electroplating, any copper oxide can be potentially reduced to copper metal. Thus, less copper seed layer would dissolve on contact with the bulk electroplating solution and thus the copper seed layer continuity and uniformity is maintained. Note that it is desirable to perform the bulk electroplating immediately after the annealing so as to reduce the likelihood of any copper oxide formation. However, the benefits of copper oxide reduction may be derived with a shorter anneal than that is required to strengthen the copper-ruthenium interface.

The inventors unexpectedly found that a post copper seed layer anneal reduces or eliminates the voids formed after a bulk-layer electroplating and a post electrofill anneal. Though not intending to be bound by this theory, it is believed that annealing the seed layer strengthens and stabilizes the copper/semi-noble metal interface. Non-uniform or rough semi-noble metal coverage and/or non-uniform copper seed layer coverage can result in a weak interface, and a weak interface can result in void formation when the wafer undergoes stress during post electrofill anneal. Note that the copper oxide reduction and copper-ruthenium interface stabilization anneals do not need to have the same process requirements Anneal conditions for achieving the copper oxide reduction may not produce enough interface strengthening.

Figure 6A:
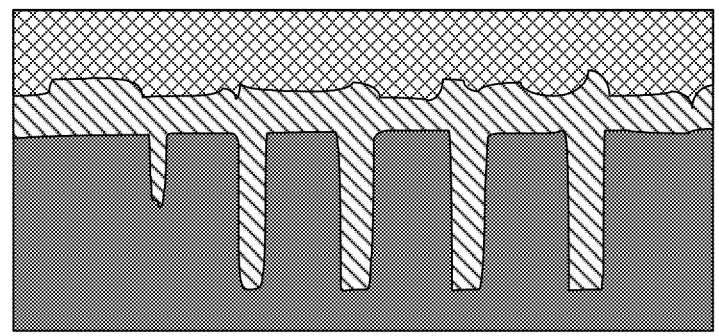
FIGS. 6A and 6B are graphical representations of SEM photos of copper metallization stacks including annealed PVD copper seed and unannealed PVD copper seed layers over a tantalum layer.
Figure 6B:
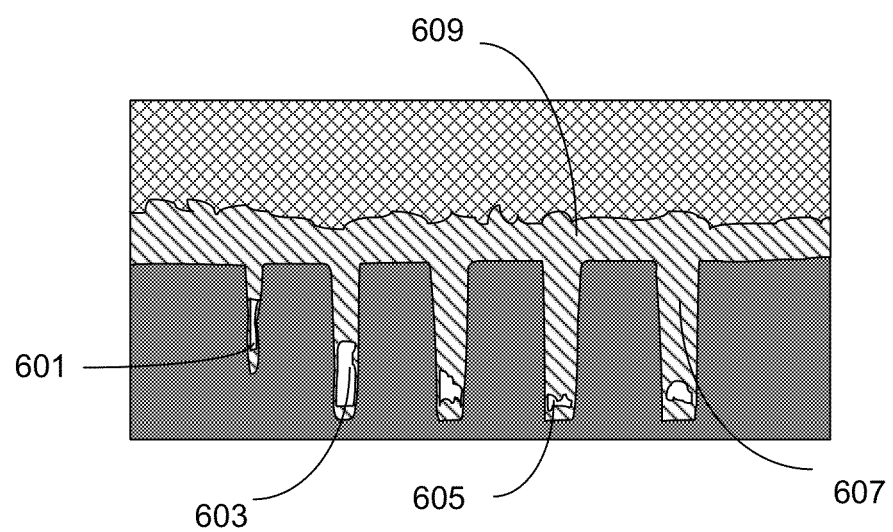

Under certain annealing conditions, the copper can agglomerate and thereby negate the benefits of the anneal. Annealing of a copper seed layer over conventional diffusion barrier materials such as tantalum tends to increase the void formation by agglomerating the copper seed layer. FIGS. 6A and 6B are depictions of SEM photos showing the effect of an anneal of a PVD copper seed layer over tantalum. FIG. 6A corresponds to no anneal, and FIG. 6B corresponds to an anneal at 150° C. for 120 seconds of a 1000 angstrom PVD copper seed over 100 angstrom tantalum. After anneal, 1220 Angstroms of copper (609) was electroplated over the copper seed layer. For vias 607 of various sizes, voids such as 601, 603, and 605 formed. FIG. 6A, without an anneal, showed no void formation.

The inventors discovered that annealing a copper seed layer deposited over a semi-noble metal layer, however, does not increase void formation, but rather decreases it under a specific range of annealing conditions. It is believed that the copper seed layer deposited over a semi-noble metal layer has a reduced tendency to agglomerate under these conditions. The inventors also discovered certain annealing conditions where the copper seed/semi-noble metal interface can be strengthened and stabilized without the undesirable agglomerating effect.

The copper seed layer is annealed by subjecting the wafer to an annealing temperature for a period of time in the presence of a reducing atmosphere. The wafer is placed in an anneal station. The anneal station may be maintained at an annealing temperature of about 100 to 400° C., or about 100 to 200° C., or about 150° C. The wafer may be annealed for a period of about 10 to 1000 seconds, about 300 to 900 seconds, or about 120 seconds. Factors that affect the annealing temperature are annealing duration, thickness of the copper seed layer, and roughness of the copper seed and underlying semi-noble metal layers. On the other hand, factors affecting the annealing duration include the annealing temperature, thickness of the copper seed layer, roughness of the copper seed layer and the underlying semi-noble metal layer. In one example, a copper seed film anneals at a temperature of 180° C. for two minutes. In another example, a copper seed film may be annealed at 225° C. for 90 seconds. In yet another example, a copper seed film may be annealed at 150° C. for 15 minutes. Manufacturing conditions may favor shorter anneals, and a thermal budget or specific partially fabricated semiconductor device may favor cooler anneals. For example, some low k dielectric properties may be affected by anneal temperatures greater than about 250° C.

Additionally, the pressure and type of reducing environment may also affect the anneal process parameters. The reducing atmosphere is a non-oxidizing atmosphere and may be an atmosphere containing hydrogen, e.g., forming gas. The reducing atmosphere may be hydrogen plasma or other reducing plasma or atmospheres. Forming gas may include up to 10% hydrogen mixed with nitrogen. Other inert gas such as argon may be mixed with hydrogen to the same effect.

In some embodiments, the anneal is performed in an atmosphere having a low concentration of oxygen. An atmosphere having an oxygen concentration of 10 ppm or less may be considered an atmosphere having a low concentration of oxygen. In some embodiments, the oxygen concentration of the anneal atmosphere is about 2 ppm or less or about 1 ppm or less. In some embodiments, the oxygen concentration of the anneal atmosphere is about 1 ppm to 2 ppm. Annealing the copper seed layer in an atmosphere having a low oxygen concentration may result in lower roughness and lower sheet resistance of the copper seed layer.

Electroplating a Bulk Layer to Fill the Features

Copper plating to fill the features is made more difficult by the very thin or even discontinuous seed layer. As discussed above, very thin films have higher sheet resistance that produces a terminal effect under conventional copper electroplating conditions. Embodiments disclosed herein involve bulk-electroplating operations performed under conditions that reduce the terminal effect. These conditions may include modifications of electrolyte composition and introduction of new configurations of the plating apparatus.

In general, in order to achieve a uniform thickness distribution of plated copper on the wafer surface a uniform voltage profile should exist at the wafer surface during plating. In order to compensate for the terminal effect, it is necessary to compensate for the resistive voltage drop by increasing the voltage or current supplied to the inner regions of the wafer so that an equivalent interfacial potential is maintained across the full wafer surface. Alternatively, one may choose a shape of the anode chamber opening to match the plated wafer surface while adjusting for increased current flux to the edge of the wafer with shielding near the wafer edge.

The plating solution is typically composed of copper sulfate, sulfuric acid, chloride ions and organic additives. Sulfuric acid is added to the electrolyte to enhance conductivity of the plating solution. This allows electroplating at reduced applied voltages and improves uniformity of voltage applied to surfaces at varying distances from an anode. Uniform voltages lead to uniform deposition rates. Conversely, when anode and wafer are equidistant at all points, lower concentrations of acid can be used to uniformly increase resistance between the wafer and the anode. This large uniform increase in resistance can diminish the terminal effect of resistive seed layers. Therefore, it is preferred to use electrolytes with low or medium concentrations of sulfuric acid while plating on thin seed layers. Another method to increase the resistance of the electrolyte may be to use salts that form large anions in solution, discussed above.

Various electroplating apparatus configurations have been developed in order to improve the uniformity of electroplating. These configurations include shielding, dynamic shielding, anode configurations, and second cathode configurations. Shielding involves positioning dielectric material between the anode and the wafer cathode. The dielectric inserts, known as sheaths and shields, can have a variety of geometries allowing them to block the current flow between the anode and the wafer over a portion of the edge of the wafer. The shielding may be dynamic. Dynamic shielding involves movement of an iris like mechanism to divert current toward the center of the wafer as needed to compensate for terminal effect or to achieve specific profile shaping. Various field shaping methods and apparatus are described in U.S. Pat. No. 6,402,923, "Method and Apparatus for Uniform Electroplating of Integrated Circuits Using a Variable Field Shaping Element" by Mayer et al., issued Jun. 11, 2002, which is incorporated herein by reference for all purposes.

A resistive element inserted close to a wafer surface and varying resistivity through the element may also modulate thickness distribution across the wafer. High resistivity virtual anodes are described in U.S. Pat. No. 6,773,571 issued Aug. 10, 2004, titled "Method And Apparatus For Uniform Electroplating Of Thin Metal Seeded Wafer Using Multiple Segmented Virtual Anode Sources" by Mayer et al., incorporated herein by reference for all purposes.

In particular, dielectric plates with hole patterns placed near the wafer surface as a means to modulate the resistive pathway between the anode and the wafer were described in U.S. Pat. No. 6,179,983 issued Jan. 30, 2001 to Reid et al., titled "Method And Apparatus For Treating Surface Including Virtual Anode," which is incorporated by reference herein for all purposes. Use of segmented anodes with dynamic control has also been described as a means to divert current towards either the center or the edge of a wafer. Azimuthally asymmetric anodes are described in U.S. Pat. No. 7,682,498, issued Mar. 23, 2010, titled "Rotationally Asymmetric Variable Electrode Correction" by Mayer et al., which is also incorporated by reference herein for all purposes.

Yet another apparatus configuration to reduce the terminal effect is a second cathode located remotely with respect to the wafer. The remotely positioned second cathode allows modulation of current density at the wafer surface by diverting a portion of current flow from the near-edge region of the wafer to improve the uniformity of the plated layer.

Any of the modifications of electrolyte composition and new configurations of the plating apparatus may be used for the bulk electroplating on a wafer having a ruthenium coating and a thin or discontinuous copper seed. Particularly, combinations of the above configurations and electrolyte compositions may be effective. In one embodiment, low acid electrolyte chemistry was used with hardware configurations including high resistance virtual anode, dual cathode, and various dielectric inserts in the plating bath to shape the current field.

The Metallization Stack

The metallization stack on a semiconductor wafer made using the methods disclosed herein includes a dielectric layer, a semi-noble metal layer, an annealed copper seed layer, and a bulk copper layer as viewed from the edge of an copper interconnect to the center of the interconnect. The semi-noble metal layer may be the metal diffusion barrier layer or a portion of a metal diffusion barrier layer. The semi-noble metal layer may be ruthenium, palladium, rhodium, iridium, osmium, cobalt, or nickel. The other portion of a bi-layer metal diffusion barrier may be titanium (Ti), tantalum (Ta), tantalum nitride (TaN), tantalum nitride silicon (TaNSi), tungsten (W), titanium nitride (TiN), or titanium nitride silicon (TiNSi). In the bi-layer configuration, the stack viewed horizontally into the interconnect may include a dielectric layer, a tantalum nitride layer, a semi-noble metal layer, an annealed copper seed layer and a bulk copper layer. In certain embodiments where the copper seed layer is not continuous, the stack may be different in some locations because the copper seed layer may be missing. The semi-noble metal layer may be ruthenium with a thickness of less than about 50 Angstroms, or about 20 to 40 Angstroms.

The annealed seed layer has an improved copper to semi-noble metal interface such that further stresses, such as those exerted by a post electrofill anneal, do not cause voids to form in the stack. If the copper seed layer is discontinuous, e.g., less than 99% coverage, about 50% to 99% coverage, any exposed underlying semi-noble surface would be un-oxidized with electroplated bulk-layer copper thereon.

Figure 7A:
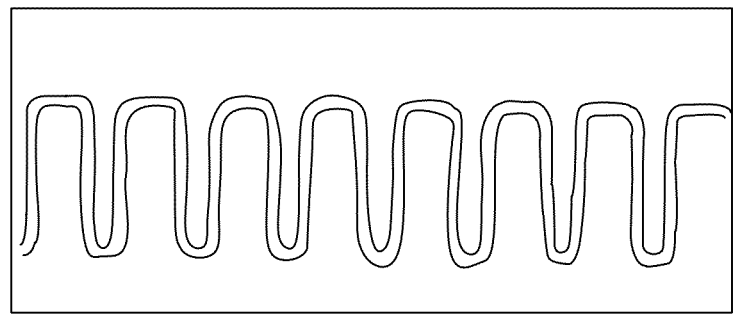
FIGS. 7A and 7B are graphical representations of SEM photos of PVD copper metallization stacks including annealed copper seed and unannealed PVD copper seed layers over a ruthenium layer.
Figure 7B:
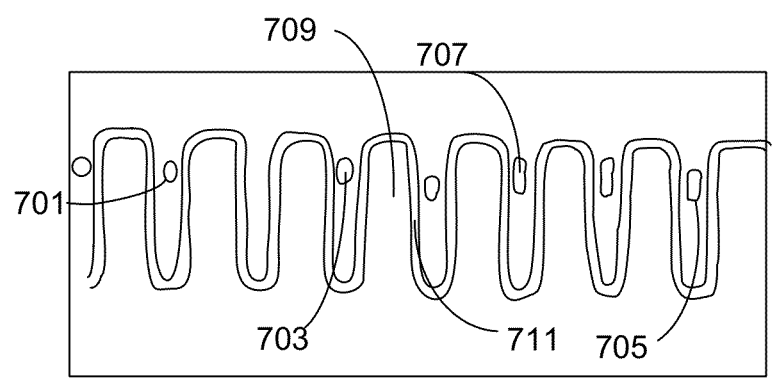

FIGS. 7A and 7B are graphical representations of SEM photo of metallization stacks with and without a post copper seed layer anneal. FIG. 7A represents a stack with an annealed PVD copper seed layer with a layer of ruthenium as the semi-noble layer. FIG. 7B represents a stack with a PVD copper seed layer without annealing. In both figures, about 50 Angstroms of copper seed was deposited over about 40 Angstroms of ruthenium. The gap openings are about 45 nm, with an aspect ratio of about 8:1. Referring to FIG. 7B, the underlying dielectric is shown as element 709. The barrier layer including ruthenium is shown as layer 711. Various voids, 701, 703, 705, and 707, are indicated in the features. The large voids in the upper portions of the trench indicate that the copper coverage along the upper sidewalls of the features are largely discontinuous, leaving the exposed surface oxidized resulting in poor nucleation and growth leading to void formation as noted in FIG. 5.

In FIG. 7A, the same PVD copper seed was annealed at 150° C. for 90 seconds before the bulk electroplating Annealing before bulk-layer electroplating significantly improved fill in the features and no voids were formed.

For electroplated copper seed, the annealed copper seed layer also has some different electrical properties. In one experiment, 50 Angstroms copper seed layer was electroplated onto three wafers having 30 Angstroms of ruthenium. These three samples of electroplated copper seed layer were subjected to different annealing conditions. In one case, the seed layer was not annealed. In another case, the seed layer was annealed at 150° C. for 5 minutes. In a third case, the seed layer was annealed at 150° C. for 10 minutes. The sheet resistance of each seed layer was measured.

| Electroplated Copper Seed Layer Thickness (Angstroms) | Anneal Conditions | Sheet Resistance (Ω/square) |
|---|---|---|
| 50 | None | 35.5 |
| 50 | 150° C./5 minutes | 31.5 |
| 50 | 150° C./10 minutes | 31.6 |

A sheet resistance is a measure of resistance of thin films that have a uniform thickness and has the unit of Ω/square. As discussed above, a lower sheet resistance indicates less voltage drop across a wafer during electroplating. Sheet resistance is also an indication of the quality of interface between the ruthenium and copper seed layer. As shown, after annealing for 5 minutes, sheet resistance decreases. However, more annealing (10 minutes) did not seem to affect the sheet resistance. The data shows that as compared to an unannealed seed layer, the annealed seed layer has better adhesion and stability as shown by the lower sheet resistance. The data also show that the sheet resistance improvement appears to be a step function at the level investigated. More anneal does not seem to affect the sheet resistance.

Further Embodiments

The apparatus/methods described hereinabove also may be used in conjunction with lithographic patterning tools or processes, for example, for the fabrication or manufacture of semiconductor devices, displays, LEDs, photovoltaic panels, and the like. Typically, though not necessarily, such tools/processes will be used or conducted together in a common fabrication facility. Lithographic patterning of a film typically comprises some or all of the following steps, each step enabled with a number of possible tools: (1) application of photoresist on a work piece, i.e., substrate, using a spin-on or spray-on tool; (2) curing of the photoresist using a hot plate or furnace or UV curing tool; (3) exposing the photoresist to visible or UV or x-ray light with a tool such as a wafer stepper; (4) developing the photoresist so as to selectively remove photoresist and thereby pattern it using a tool such as a wet bench; (5) transferring the photoresist pattern into an underlying film or work piece by using a dry or plasma-assisted etching tool; and (6) removing the photoresist using a tool such as an RF or microwave plasma resist stripper.

It is understood that the examples and embodiments described herein are for illustrative purposes only and that various modifications or changes in light thereof will be suggested to persons skilled in the art. Although various details have been omitted for clarity's sake, various design alternatives may be implemented. Therefore, the present examples are to be considered as illustrative and not restrictive, and the disclosed embodiments are not to be limited to the details given herein, but may be modified within the scope of the appended claims. Further it is understood that many features presented in this application can be practiced separately as well as in any suitable combination with each other, as will be understood by one of ordinary skill in the art.

What is claimed is:

1. A method comprising:
providing a semiconductor wafer having a ruthenium layer about 40 Angstroms thick or less on a surface of and on features in the semiconductor wafer;
depositing a copper seed layer on the ruthenium layer; and
annealing the copper seed layer in a reducing atmosphere having an oxygen concentration of about 2 parts per million or less.

2. The method of claim 1, further comprising:
electroplating a bulk-layer of copper onto the annealed copper seed layer.

3. The method of claim 1, wherein the reducing atmosphere includes forming gas.

4. The method of claim 1, wherein an annealing temperature is about 100° C. to 400° C.

5. The method of claim 1, wherein the semiconductor wafer is annealed for a period of about 10 seconds to 1000 seconds.

6. The method of claim 1, further comprising:
before depositing the copper seed layer, annealing the ruthenium layer.

7. The method of claim 1, wherein the deposited copper seed layer has a thickness of about 15 Angstroms to 60 Angstroms.

8. The method of claim 1, wherein the depositing the copper seed layer on the ruthenium layer is performed using an electroplating process, the electroplating process including forward current operations and reverse current operations.

9. The method of claim 8, wherein the forward current operations include a current of about 0.5 amps to 1.25 amps for a period of about 2 seconds to 5 seconds, wherein the reverse current operations include a current of about 1 amp to 2 amps for a period of about 50 milliseconds to 200 milliseconds, and wherein the forward current operations and the reverse current operations are alternately repeated for a period of about 15 seconds to 60 seconds.

10. The method of claim 1, wherein the ruthenium layer on the surface of the semiconductor wafer is about 30 Angstroms thick or less.

11. The method of claim 1, wherein the reducing atmosphere has an oxygen concentration of about 1 part per million or less.

12. The method of claim 1, wherein a root mean square roughness of the copper seed layer is about 40 Angstroms or less after annealing the copper seed layer.

13. The method of claim 1, further comprising:
applying photoresist to the semiconductor wafer;
exposing the photoresist to light;
patterning the photoresist and transferring the pattern to the semiconductor wafer; and
selectively removing the photoresist from the semiconductor wafer.

14. A method comprising:
providing a semiconductor wafer having a ruthenium layer about 40 Angstroms thick or less on a surface of and on features in the semiconductor wafer;
depositing a copper alloy seed layer on the ruthenium layer; and
annealing the copper alloy seed layer in a reducing atmosphere having an oxygen concentration of about 2 parts per million or less.

15. The method of claim 14, wherein an alloying element of the copper alloy seed layer is selected from the group consisting of chromium, iron, cobalt, nickel, zinc, ruthenium, rhodium, palladium, silver, indium, tin, tellurium, platinum, gold, and lead.

16. The method of claim 14, wherein the deposited copper alloy seed layer includes about 0.1 weight percent to 5 weight percent of an alloying element.

17. The method of claim 14, wherein the depositing the copper alloy seed layer on the ruthenium layer is performed using an electroplating process, the electroplating process including forward current operations and reverse current operations.

18. The method of claim 17, wherein the forward current operations include a current of about 0.5 amps to 1.25 amps for a period of about 2 seconds to 5 seconds, wherein the reverse current operations include a current of about 1 amp to 2 amps for a period of about 50 milliseconds to 200 milliseconds, and wherein the forward current operations and the reverse current operations are alternately repeated for a period of about 15 seconds to 60 seconds.

19. The method of claim 14, wherein the ruthenium layer on the surface of the semiconductor wafer is about 30 Angstroms thick or less.

20. The method of claim 14, wherein the reducing atmosphere has an oxygen concentration of about 1 part per million or less.

21. The method of claim 14, wherein a root mean square roughness of the copper alloy seed layer is about 40 Angstroms or less after annealing the copper alloy seed layer.

22. A non-transitory computer machine-readable medium comprising program instructions for control of an apparatus, the instructions comprising code for:
providing a semiconductor wafer having a ruthenium layer about 40 Angstroms thick or less on a surface of and on features in the semiconductor wafer;
depositing a copper seed layer on the ruthenium layer; and
annealing the copper seed layer in a reducing atmosphere having an oxygen concentration of about 2 parts per million or less.

23. A system comprising:
an electroplating apparatus;
an annealing furnace; and
one or more controllers including program instructions for conducting a process including:
receiving a semiconductor wafer in the electroplating apparatus;
depositing a copper seed layer on the wafer in the electroplating apparatus with an electroplating process, under conditions for depositing the copper seed layer on a ruthenium layer having a thickness of about 40 Angstroms or less on the semiconductor wafer surface and on features in the semiconductor wafer; and
annealing the copper seed layer in a reducing atmosphere having an oxygen concentration of about 2 parts per million or less in the annealing furnace.

24. The system of claim 23, further comprising:
a stepper.

* * * * *